United States Patent [19]

Sato et al.

(10) Patent No.: US 6,938,191 B2
(45) Date of Patent: Aug. 30, 2005

(54) ACCESS CONTROL DEVICE AND TESTING METHOD

(75) Inventors: Keiji Sato, Kawasaki (JP); Toshiro Nakazuru, Kawasaki (JP); Shigeaki Okutani, Kawasaki (JP); Noboru Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 437 days.

(21) Appl. No.: 10/103,787

(22) Filed: Mar. 25, 2002

(65) Prior Publication Data

US 2003/0046619 A1 Mar. 6, 2003

(30) Foreign Application Priority Data

Aug. 31, 2001 (JP) ........................................ 2001-264703

(51) Int. Cl.[7] ........................... G06F 11/00; G01R 31/28
(52) U.S. Cl. ........................................ 714/703; 714/724
(58) Field of Search ............................... 714/703, 724, 714/726, 727, 729, 733

(56) References Cited

U.S. PATENT DOCUMENTS 5,377,198 A * 12/1994 Simpson et al. ............ 714/727

FOREIGN PATENT DOCUMENTS

JP 11-282717 10/1999

* cited by examiner

*Primary Examiner*—Albert Decady
*Assistant Examiner*—James C Kerveros
(74) *Attorney, Agent, or Firm*—Staas & Halsey LLP

(57) ABSTRACT

The present invention provides an access control device and a testing method that can simplify the software operations in an access control operation such as a JTAG control operation, and enable the hardware to perform a high-speed control operation. The access control device conducts a test or diagnosis on an object by accessing a serial interface based on a command and data that specify a testing or diagnosing route. Under the control of a processor, a control circuit in the access control device executes an access sequence in accordance with a command string and an input data string stored in a memory, and stores the data outputted from the object to be tested or diagnosed in the memory as an output data string. The control circuit sets a state transition route for each objective state in advance, so that a transition route can be readily determined for an objective state specified by the command string.

22 Claims, 37 Drawing Sheets

FIG.2

| SOFTWARE OPERATION | HARDWARE OPERATION |
|---|---|
| WRITE A COMMAND TO SELECT DR4 IN THE WINDOW REGISTER | |
| SPECIFY THE AMOUNT OF SHIFT FOR IR | CHANGE STATES AND PERFORM A SHIFT OPERATION ACCORDING TO THE SPECIFIED AMOUNT OF SHIFT |
| SPECIFY THE AMOUNT OF SHIFT FOR DR | CHANGE STATES AND PERFORM A SHIFT OPERATION ACCORDING TO THE SPECIFIED AMOUNT OF SHIFT |
| WRITE DATA TO SET DR4 IN THE WINDOW REGISTER | |
| SPECIFY THE AMOUNT OF SHIFT FOR DR | CHANGE STATES AND PERFORM A SHIFT OPERATION ACCORDING TO THE SPECIFIED AMOUNT OF SHIFT |
| WRITE A COMMAND TO SELECT DR5 IN THE WINDOW REGISTER | |
| SPECIFY THE AMOUNT OF SHIFT FOR IR | CHANGE STATES AND PERFORM A SHIFT OPERATION ACCORDING TO THE SPECIFIED AMOUNT OF SHIFT |
| SPECIFY THE AMOUNT OF SHIFT FOR DR | CHANGE STATES AND PERFORM A SHIFT OPERATION ACCORDING TO THE SPECIFIED AMOUNT OF SHIFT |
| READ THE VALUE OF DR5 FROM THE WINDOW REGISTER | |
| SPECIFY THE AMOUNT OF SHIFT FOR DR | CHANGE STATES AND PERFORM A SHIFT OPERATION ACCORDING TO THE SPECIFIED AMOUNT OF SHIFT |

FIG.4

| SOFTWARE OPERATION | HARDWARE OPERATION |
|---|---|
| SELECTION COMMAND OF DR4 SET IN IR | |
| DATA TO BE WRITTEN IN DR4 | |
| WRITE A SELECTION COMMAND OF DR5 IN MEMORY | |
| CHANGE THE WHOLE SEQUENCE TO COMMNADS AND WRITE TO MEMORY | |
| ACTIVATES HARDWARE AND WAIT COMPLETION OF HARDWARE | |
| | PERFORMS THE SEQUENCE ACCORDING TO COMMANDS |
| READ OUT DR5 CONTENTS FROM MEMORY | |

FIG.5

| 31~16 | 15~08 | 7 | 6 | 5 | 4 | 3 | 2 | 1 | 0 |
|---|---|---|---|---|---|---|---|---|---|
| Loop Count | Shift Count | GET | SET | 0 | Command Code | | | | |

FIG.7

| Code | OP Code | Code | OP Code | Code | OP Code | Code | OP Code |
|---|---|---|---|---|---|---|---|
| 00000 | Test-Reset | 01000 | Run-Idle | 10000 | | 11000 | |
| 00001 | Select-DR | 01001 | Select-IR | 10001 | | 11001 | |
| 00010 | Capture-DR | 01010 | Capture-IR | 10010 | | 11010 | |
| 00011 | Shift-DR | 01011 | Shift-IR | 10011 | Shift-DR+ Exit1-DR | 11011 | Shift-IR+ Exit1-IR |
| 00100 | Exit1-DR | 01100 | Exit1-IR | 10100 | | 11100 | |
| 00101 | Pause-DR | 01101 | Pause-IR | 10101 | | 11101 | |
| 00110 | Exit2-DR | 01110 | Exit2-IR | 10110 | | 11110 | |
| 00111 | Update-DR | 01111 | Update-IR | 10111 | | 11111 | |

FIG.24

| NUMBER | Loop Count | Shift Count | GET | SET | Command Code | EXPLANATION OF OPERATIONS |
|---|---|---|---|---|---|---|
| 1 | 5 | — | — | — | Test-Logic-Reset | REPEAT TEST-LOGIC-RESET 5 TIMES |
| 2 | 1 | 8 | 0 | 1 | Shift-IR+Exit1-IR | SET 8 BITS IN IR |
| 3 | 4 | 16 | 0 | 1 | Shift-DR+Exit1-DR | REPEAT THE SETTING OF 16 BITS IN DR 4 TIMES |
| 4 | 1 | 8 | 1 | 1 | Shift-IR+Exit1-IR | READ 8 BITS OUT OF IR AND SET 8 BITS AGAIN |
| 5 | 2 | 0 | 1 | 0 | Shift-DR | READ OUT 513 BITS OUT OF DR (256 × 2+1) |
| 6 | 1 | 1 | 1 | 0 | Shift-DR+Exit1-DR | |
| 7 | 1 | 8 | 1 | 0 | Shift-IR+Exit1-IR | READ 8 BITS OUT OF IR |
| 8 | 1 | — | — | — | Test-Logic-Reset | SET TEST-LOGIC-RESET |

FIG.25

| WORD ORDER | BIT LOCATION 31-30-29-...-9-8-7-6-5-4-3-2-1-0 | | |
|---|---|---|---|
| 0 | don't care | | IR 8bit |
| 1 | don't care | DR 16bit | |
| 2 | don't care | DR 16bit | |
| 3 | don't care | DR 16bit | |
| 4 | don't care | DR 16bit | |
| 5 | don't care | | IR 8bit |

FIG.26

| WORD ORDER | BIT LOCATION | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| 0 | don't care | | | | | | | | | | | | | | | | | | | | | | | | | | IR 8bit | | | | | |
| 1 | FIRST BITS 31 THROUGH 0 OF 513 BITS IN DR | | | | | | | | | | | | | | | | | | | | | | | | | | | | | | | |
| ~ | ~ | | | | | | | | | | | | | | | | | | | | | | | | | | | | | | | |
| 16 | LAST BITS 511 THROUGH 480 OF 513 BITS IN DR | | | | | | | | | | | | | | | | | | | | | | | | | | | | | | | |
| 17 | don't care | | | | | | | | | | | | | | | | | | | | | | | | | | | | | | * | |
| 18 | | | | | | | | | | | | | | | | | | | | | | | | | | | IR 8bit | | | | | |

FIG.27

| NUMBER | Loop Count | Shift Count | GET | SET | Command Code | EXPLANATION OF OPERATIONS |
|---|---|---|---|---|---|---|
| 1 | 1 | 4 | 0 | 0 | Shift-DR | SHIFT BY 4 BITS AND RETURN BY 3 BITS |
| 2 | 1 | 2 | 0 | 1 | Shift-DR | SET DATA OF 2 BITS |
| 3 | 1 | 3 | 0 | 0 | Shift-DR | RETURN BY 3 BITS |
| 4 | 1 | — | — | — | Test-Logic-Reset | SET TEST-LOGIC-RESET |

FIG.29

| 11 | 10 | 9 | 8 | 7 | 6 | 5 | 4 | 3 | 2 | 1 | 0 |
|----|----|---|---|---|---|---|---|----|----|---|---|
| P  | OPERATION CODE |   |   |   |   |   |   | ST1 | ST0 | 0 | 1 |
| P  | OPERATION CODE |   |   |   |   |   |   | 0  | 0  | – | – |

FIG.30

| 11 | 10 | 9 | 8 | 7 | 6 | 5 | 4 | 3 | 2 | 1 | 0 |
|---|---|---|---|---|---|---|---|---|---|---|---|
| P | W | R | \multicolumn{5}{c|}{OPERATION CODE DR SELECTING} | 0 | 0 | – | – |

FIG.33

| 31~16 | 15~08 | 7 | 6 | 5 | 4 | 3 | 2 | 1 | 0 |
|---|---|---|---|---|---|---|---|---|---|
| N/A | N/A | | | 1 | HIERARCHY SELECTING CONDITION | | | | |

ACCESS CONTROL DEVICE AND TESTING METHOD

BACKGROUND OF THE INVENTION

The present invention generally relates to access control devices and testing methods, and, more particularly, to an access control device and a testing method by which a printed substrate test, a test on a device incorporated into a system, a system control operation, a system monitoring operation, and a system diagnosis are conducted through high-speed access to serial interfaces based on a command and data that specify a testing route or a diagnosing route.

The present invention is particularly suitable for making a high-speed access to a serial interface to which the testing method of the IEEE Standard 1149.1 introduced by the Joint Test Action Group (hereinafter referred to as JTAG for short) is applied. A testing method in accordance with the present invention is designed for testing or diagnosing an object device.

Conventionally, the JTAG technique is used in tests for detecting defective products among printed wiring boards. Since there is no need to perform a particularly high-speed operation and the control process is complicated, a control operation that puts emphasis on the software (hereinafter referred to as a JTAG control operation) is performed.

Among the simplest methods, there is a first method in which signals necessary for a JTAG control operation such as a TCK (Test Clock) signal, a TMS (Test Mode Select) signal, a TDI (Test Data In) signal, a TDO (Test Data Out) signal are stored in registers that can be accessed from the software, and the software changes the register contests between "1" and "0" so as to change states and writes data (TDI signal), thereby reading out the TDO signal.

As a higher-speed method, there is a second method in which shift registers each having a predetermined number of bits and accessible from the software for read and write are provided on the side of the control device, and the shift registers are connected in a loop-like state to the register of a device such as a boundary cell, so that the software can perform read and write operations with the shift registers as a window.

FIG. 1 is a block diagram showing the structure of a conventional access control device that employs the second method. In this structure, accesses to an instruction register (IR) 3 and data registers (DR) 4 through 6 are controlled using a window register 2 that can be read and write by a processor 1. More specifically, an instruction for specifying which of the data registers 4 through 6 is to be accessed is written in the instruction register 3. After setting a value in the window register 2, the software of the processor 1 performs a shift operation to write via a pin (TAP) 7. Also, after a shift operation, the processor 1 reads out from the window register 2 the value of a selected one of the data registers outputted via a TDO signal.

FIG. 2 shows software operations and hardware operations performed by the access control device shown in FIG. 1. As an example, FIG. 2 shows a sequence of a case where the value of a TDI signal is written in the data register 4, and the contents of the data register 5 are read out as a TDO signal. In this case, the software operations need to be meticulously controlled, as shown in FIG. 2.

In accordance with the first method, however, a control operation by the software requires a long time, and, therefore, high-speed processing is difficult to achieve. Especially when a large volume of data contained in a memory is to be accessed, such a control operation by the software is not suitable.

Meanwhile, the second method is not suitable, either, for making an access to a large volume of data, because a data setting operation or a read operation needs to be performed through a shift register (a window) each time, even when a control device having a shift register is connected in a loop-like manner. Also, with the second method, it is necessary to make an access to a register at short intervals, resulting in a larger process load on the software.

SUMMARY OF THE INVENTION

A general object of the present invention is to provide access control devices and testing methods in which the above disadvantages are eliminated.

A more specific object of the present invention is to provide an access control device that can simplify the software operations in an access control operation such as a JTAG control operation, and enable the hardware to perform a high-speed control operation.

The above objects of the present invention are achieved by an access control device that accesses a serial interface based on a command and data that specify a testing route or a diagnosing route, thereby conducting a test or diagnosis on an object to be tested or diagnosed. This access control device includes: a memory; a control circuit for supplying the command and data to the object to be tested or diagnosed, and inputting data outputted from the object to be tested or diagnosed; and a processor. Under the control of the processor, the control circuit executes an access sequence in accordance with a command sting and an input string, and stores output data from the object to be tested or diagnosed as an output data string in the memory. The control circuit also sets a state transition route for each objective state in advance, so that the state transition route can be readily determined for an objective state designated by the command string.

The above objects of the present invention are also achieved by a method of testing a test object by accessing a serial interface based on a command and data that specify a testing route. This method includes the steps of: performing a controlling operation by executing an access sequence in accordance with a command string and an input data string stored in a memory in a testing device, and then storing output data from a test object as an output data string in the memory; and setting a state transition route for each objective state in advance, so that a transition route can be readily determined for an objective state specified by the command string.

With the above access control device or the testing method in accordance with the present invention, a software operation in an access control operation such as a JTAG control operation can be simplified, and a high-speed control operation can be performed by the hardware.

The above and other objects and features of the present invention will become more apparent from the following description taken in conjunction with the accompanying drawings.

BRIEF DESCRIPTION OF THE DRAWINGS

FIG. 2 shows software operations and hardware operations performed by the access control device shown in FIG. 1;

FIG. 4 shows software operations and hardware operations performed by the access control device shown in FIG. 3;

FIG. 5 shows the structure of a command used in the access control device shown in FIG. 3;

FIG. 7 shows the correspondence between command codes and operation codes;

FIG. 24 shows command strings in accordance with the present invention;

FIG. 25 shows a case where a TDI data string has 32 bits as a word unit;

FIG. 26 shows a case where a TDO data string has 32 bits as a word unit;

FIG. 27 shows command strings in a case where a part of the bits in the data register in the device is to be rewritten;

FIG. 29 shows an operation performed by the instruction register in a case where the instruction register of the device is provided with an error check function;

FIG. 30 shows an operation performed by the instruction register in a case where the instruction register of the device is provided with flags W and R;

FIG. 33 shows the structure of a command in a case where a hierarchy select signals can also be set in a command sequence;

DESCRIPTION OF THE PREFERRED EMBODIMENTS

The following is a description of embodiments of the present invention, with reference to the accompanying drawings.

Figure 3:
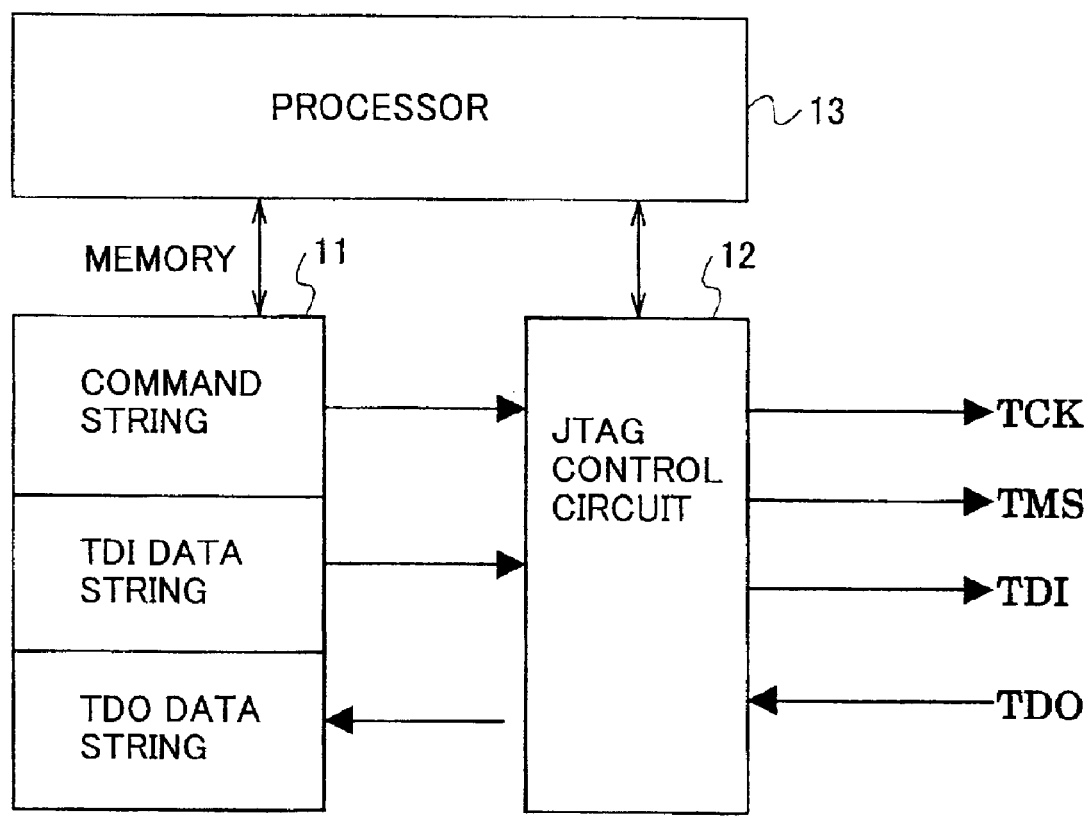
FIG. 3 is a block diagram showing an embodiment of an access control device in accordance with the present invention.

FIG. 3 is a block diagram showing an embodiment of an access control device in accordance with the present invention. This access control device of this embodiment is employed in conjunction with an embodiment of a testing method in accordance with the present invention. In this embodiment, a high-speed access is made to a serial interface, based on a command and data that specify a testing route or a diagnosing route. More specifically, to make a high-speed access under JTAG control, a command string in which a JTAG access sequence is coded and an output data string (or a TDI data string) to be outputted as a TDI signal are stored beforehand in a memory 11, and a JTAG control circuit 12 is then activated. The memory 11 and the JTAG control circuit 12, together with a processor 13 such as a CPU, constitute the access control device.

In the JTAG control circuit 12, states are switched by controlling TCK and TMS signals in accordance with the sequence written in the command string. If a shift instruction and an output operation are specified, the data is read out from the TDI data string, and is then outputted as a TDI signal. If a shift instruction and an input operation are specified, the data obtained as a TDO signal is developed into an input data string (a TDO data string) in the memory 11.

In this structure, there is no need for the software of the processor 13 to intervene during a JTAG control operation, when an access to a device (not shown) having a structure that complies with the JTAG standard is controlled. Accordingly, a high-speed access to the device can be achieved.

The software of the processor 13 prepares a sequence in advance, and then activates the JTAG control circuit 12. After the completion of the operation by the JTAG control circuit 12, the software of the processor 13 performs an operation in accordance with the result of the operation by the JTAG control circuit 12. In this structure, there is no need to perform a JTAG control operation from time to time, and, therefore, the load on the software of the processor 13 can be reduced. Also, a high-speed access can be made under control by hardware. Since the control operation is performed in terms of attainable states, there is no need to specify the state switching process, and each sequence can be set with a short command string.

In the above JTAG control operation, a command can determine during a shift operation whether the TDI data string in the memory 11 should be outputted as a TDI signal, and whether a TDO signal should be written as the TDO data string in the memory 11. If the TDI data string in the memory 11 is not outputted as a TDI signal, the inputted data can simply be returned as a TDO signal. In this manner, only the data necessary for an output operation in the entire sequence can be set in the TDI data string in the memory 11, while only the data necessary for analysis can be set in the TDO data string in the memory 11.

In the above JTAG control device, a command representing an access sequence can include a command to automatically switch to an Exit-1 state after the execution of a specified number of shift operations, or can specify a number of executions, so that a number of shift operations or update operations can be performed with only one command. Here, the command string can be further shortened, and a more complicated control operation can be performed.

In a device to be accessed by the access control device, the instruction register (IR) and the data registers (DR) are provided with an error detecting function for detecting an error such as a parity bit or an access procedure error. It is desirable that whether or not an instruction has been properly executed can be checked simply by reading the instruction register after the execution of the instruction. To realize this, a status flag is provided in the instruction register so that an error occurring during the execution of a long command sequence can be detected and the command sequence can be stopped. By doing so, the reliability of the JTAG control operation can be increased. Since the software awaits the completion of the entire sequence, it is difficult to adjust to the situation where an error has occurred during the execution of the sequence, compared with the prior art in which the procedures are executed one by one. To solve this problem, the execution status is checked by reading the instruction register during the execution of the sequence, so that the execution can be stopped when an error occurs. Thus, the reliability of the access control operation can be increased.

Also, in a device to be accessed by the access control device, a "data register write flag" and a "data register read flag" can be provided in the instruction register, so that a "write" operation and a "read" operation can be controlled independently of each other. In doing so, operations in an update state, a capture state, and a run-test/idle state in accordance with the JTAG can be restricted. In the JTAG, when a shift operation is performed, the operation has to pass through the Update stage. Generally, once the operation passes through the update state, the data contents are updated, and the data outputted as a TDO signal needs to be returned as a TDI signal in the shift operation, so as to verify the contents of the shift register in the update operation. To realize this, a "data register write flag" is provided in the command register. When this flag is off, the data register is not updated even after the operation passes through an update-DR state. With such an instruction system, the process of returning the data of a TDI signal becomes unnecessary. Furthermore, when an operation such as a read or write operation in the memory is performed in the run-test/idle state, the operation can be controlled with the use of the "data register write flag".

In a hierarchical system to be accessed by the access control device of this embodiment, a signal for designating a hierarchy to be accessed is provided, and a select register for selecting a device to be controlled in each hierarchy can be set with the use of the JTAG. With such a system structure, the access control device appears to have a one-to-one relationship with the devices to be accessed. Here, the JTAG control circuit is in one-to-one correspondence with the device to be controlled, and therefore a control operation can e performed only with the number of bits inherent to each device. Generally, in the JTAG, related devices are chain-connected to form a long shift register to be accessed. In such a structure, it is necessary to take the order of the devices into consideration and accordingly construct the information corresponding to the number of bits necessary for an access to each device, resulting in very complicated procedures. In accordance with the present invention, however, only one device can be seen from the JTAG control circuit, even though a plurality of devices exist. Thus, the whole procedures can be simplified.

In the above system structure, a plurality of devices in the lower hierarchies to be accessed from the upper hierarchies can be selected so that data can be simultaneously supplied to the plurality of devices. Accordingly, the same data can be supplied to a plurality of devices in a system in which a number of devices exist, and a high-speed control operation can be performed on the entire system. For instance, in a system in which a large number of FPGAs constituted by the JTAG are used, the same data can be written simultaneously in a plurality of FPGAs so as to make the system operate at a high speed and perform a write operation on a plurality of memories at the same time.

Figure 1:
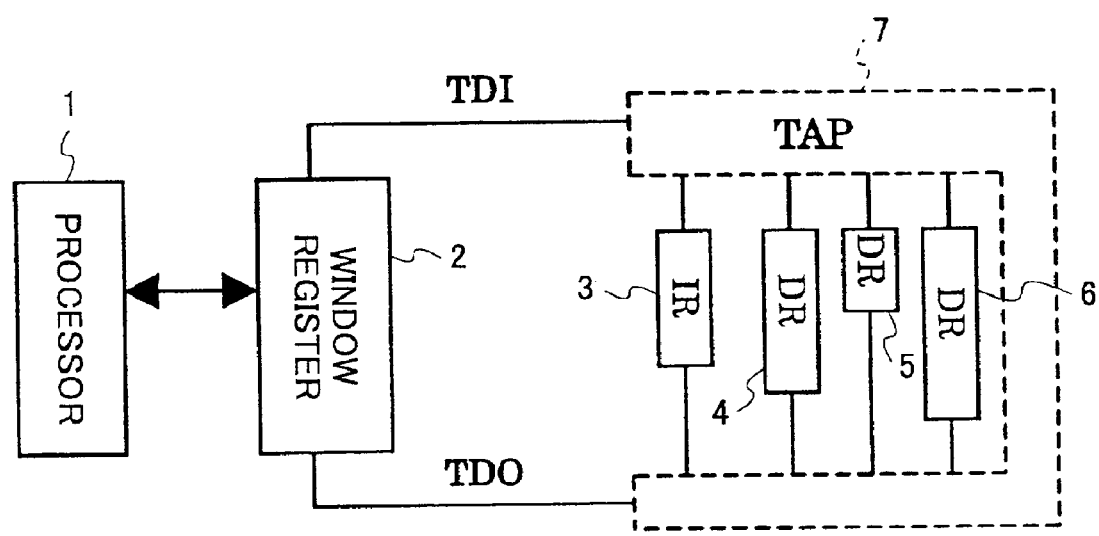
FIG. 1 is a block diagram showing the structure of a conventional access control device that employs the second method in the prior art.

In a case where the device consisting of the instruction register 3, the data register 4, the data register 5, the data register 6, and the TAP 7 shown in FIG. 1 is tested, the operations shown in FIG. 4 are performed. FIG. 4 shows a sequence in which the value of a TDI signal is written in the DR4 and the contents of the data register 5 are read out as a TDO signal, which is taken as an example of the software operations and hardware operations performed by the access control device. As shown in FIG. 4, after preparing a command, the software activates the hardware, and waits until the completion of the operations of the hardware. The software then performs post operations. In this manner, the entire series of operations are under the control of the hardware, and a high-speed access to the device can be made.

FIG. 5 shows the structure of a command. In this figure, the numbers "0" through "31" each indicate a bit location. In the Command Code section, a command code shown in FIG. 7 and described later is set. In the SET flag section, whether or not the TDI data string is to be outputted as a TDI signal is indicated. In the GET flag section, whether or not the TDO data string is to be inputted as a TDO signal is indicated.

Figure 6:
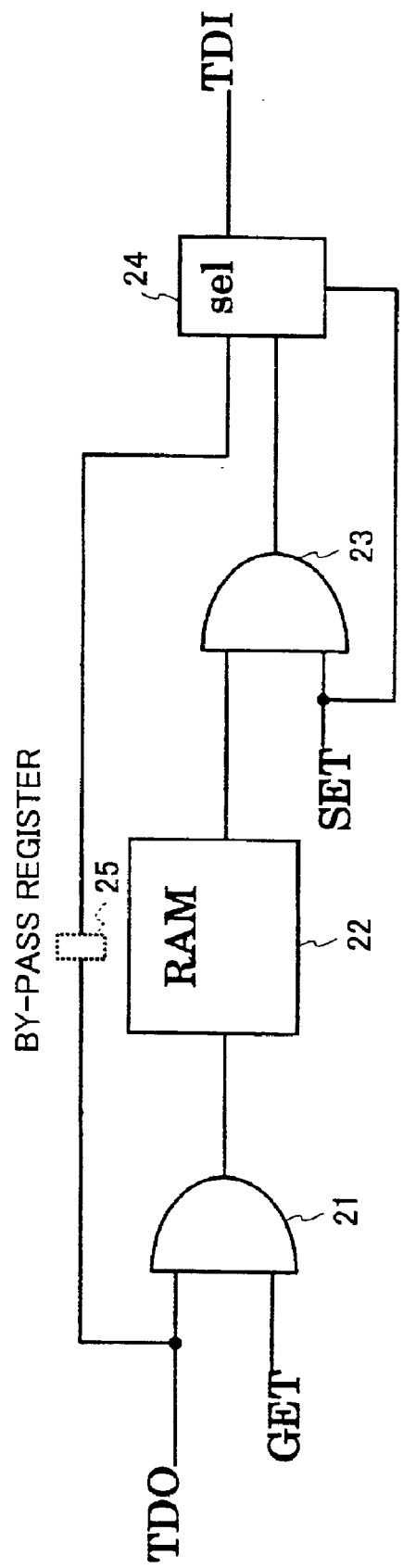
FIG. 6 is a circuit diagram showing the structures of a SET flag and a GET flag in the JTAG control circuit shown in FIG. 3.

FIG. 6 is a circuit diagram showing the structures of the SET flag and the GET flag in the JTAG control circuit 12. In this figure, reference numerals 21 and 23 indicate AND circuits, reference numeral 22 indicates a RAM, reference numeral 24 indicates a selector, and reference numeral 25 indicates a by-pass register. When the SET flag is on, the data is taken out from the RAM 22 and outputted as a TDI signal via the selector 24. When the GET flag is on, the data of a TDO signal is stored in the RAM 22. When the SET flag is off, the value of the TDO signal is returned through the selector 24 and the by-pass register 25.

In the Shift Count section shown in FIG. 5, how many times a state shift operation is to be performed is specified, when a shift command is entered. In the Loop Count section, how many times the command is to be repeated is specified. In this embodiment, when "0" is set in the Shift Count section, a state shift operation is to be performed 256 times. When "0" is set in the Loop Count section, the command is to be repeated 65,536 times.

FIG. 7 shows the correspondence between the codes of command codes (indicated as "Code") to be set in the Command Code section and the operation codes (OP Code). Each of the command codes indicates an objective state of the JTAG. A transition route is set beforehand for each objective state, so that a state control operation can be performed without a detailed state instruction. The command codes having the operation codes of "Shift-DR+Exit1-DR" and "Shift-IR+Exit1-IR" each indicate that the operation goes through a shift state the specified number of times, and switches to Exit-1.

Figure 8:
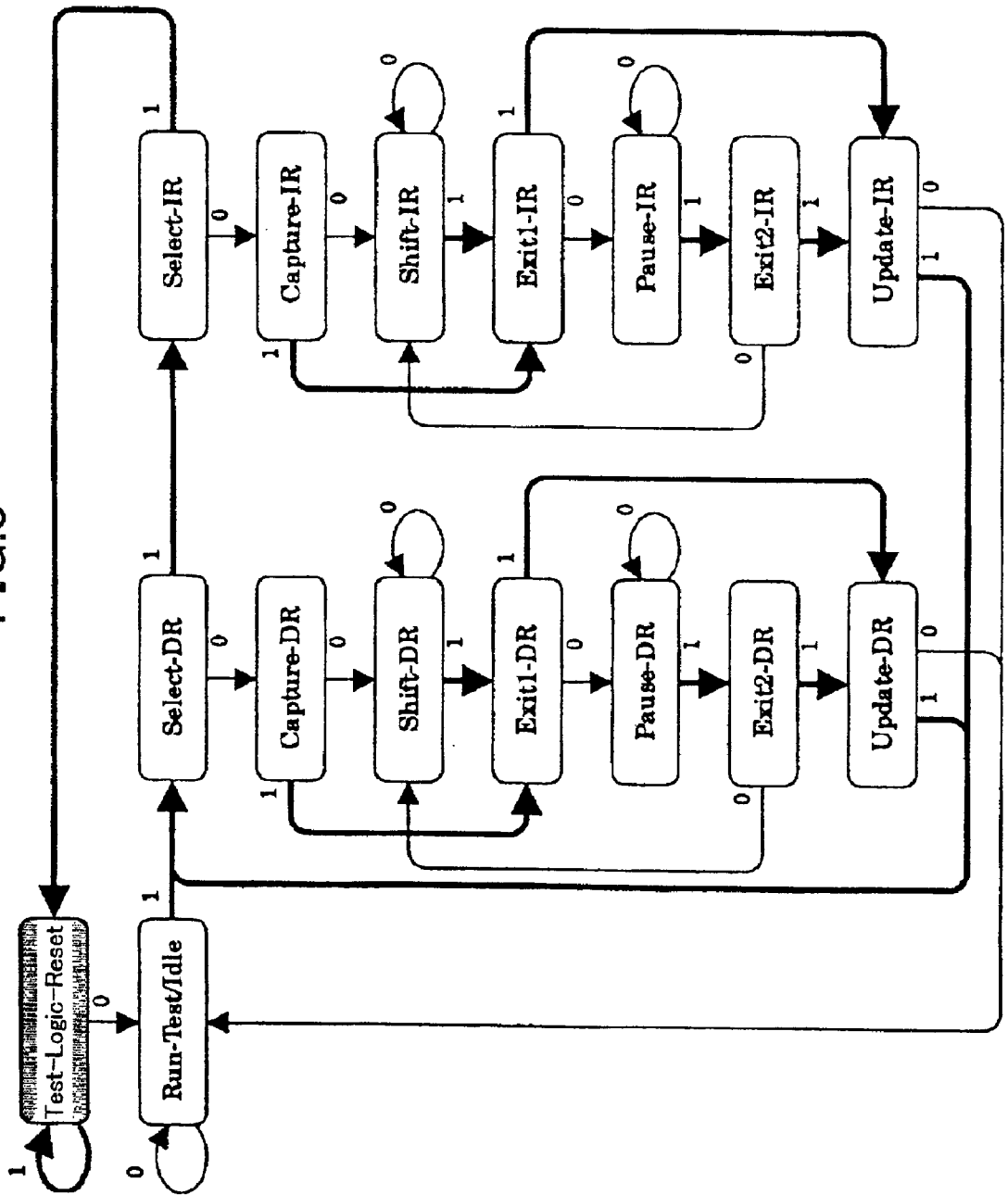
FIG. 8 shows the transition route for a first objective state in accordance with the present invention.
Figure 9:
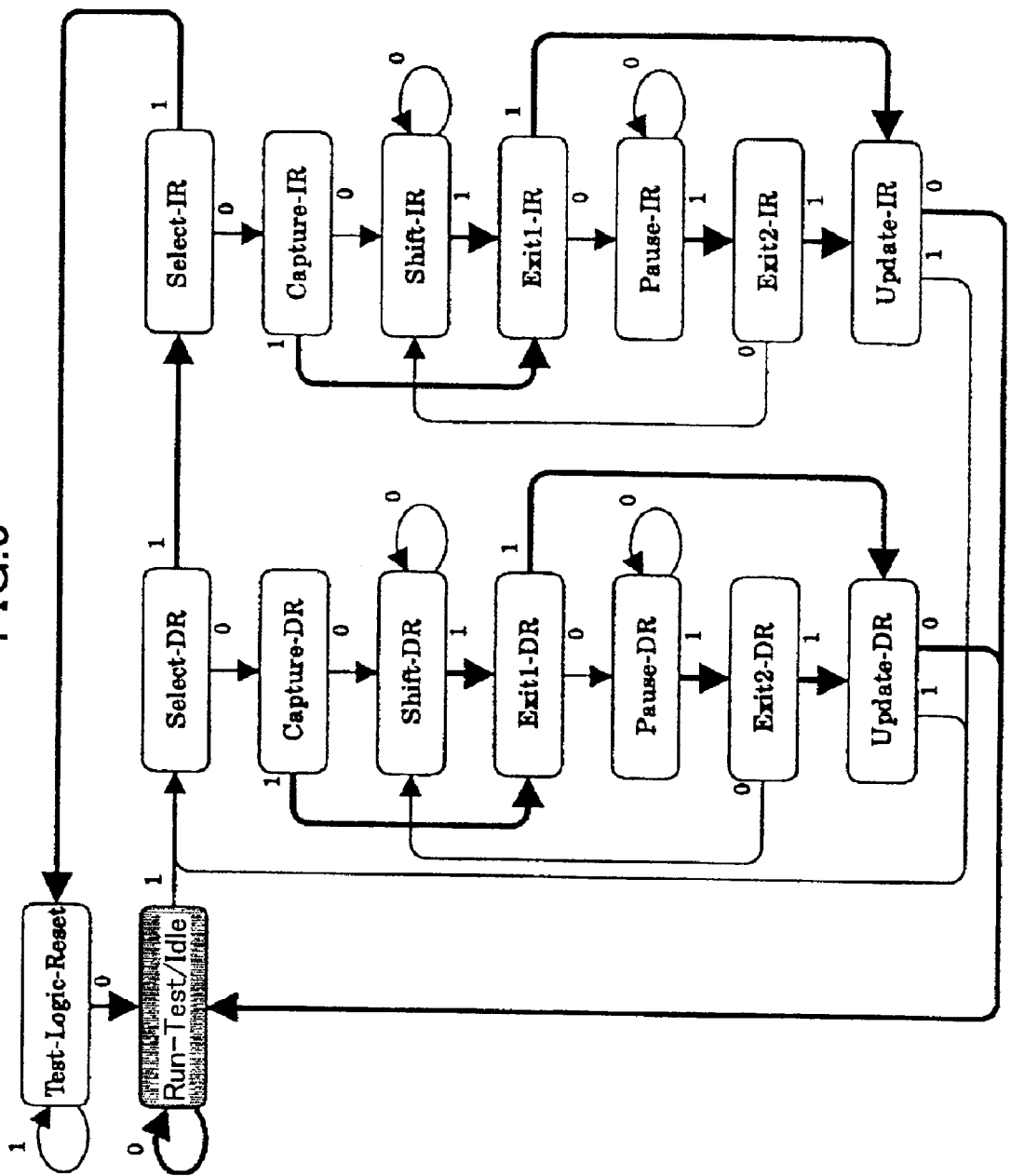
FIG. 9 shows the transition route for a second objective state.
Figure 10:
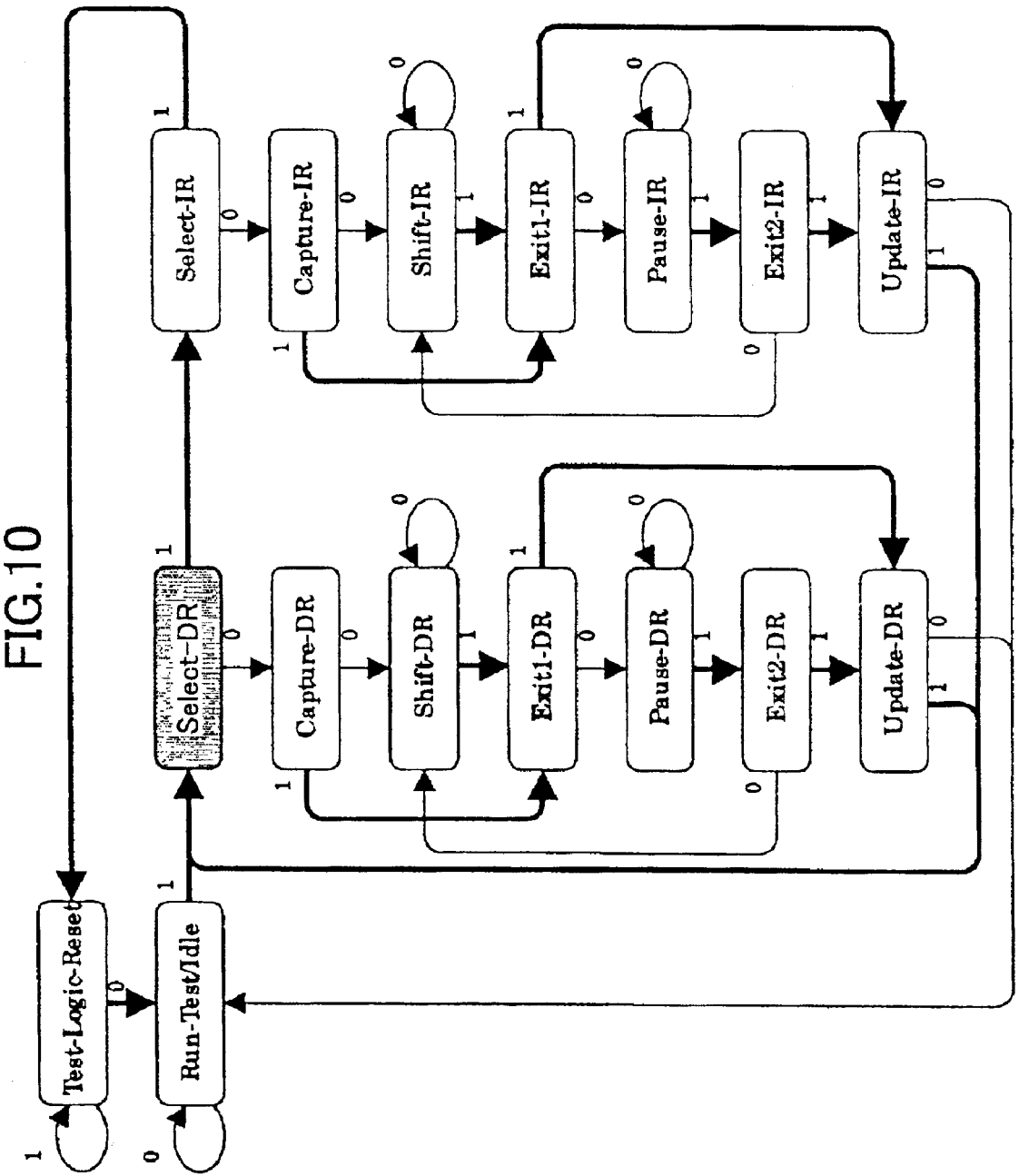
FIG. 10 shows the transition route for a third objective state.
Figure 11:
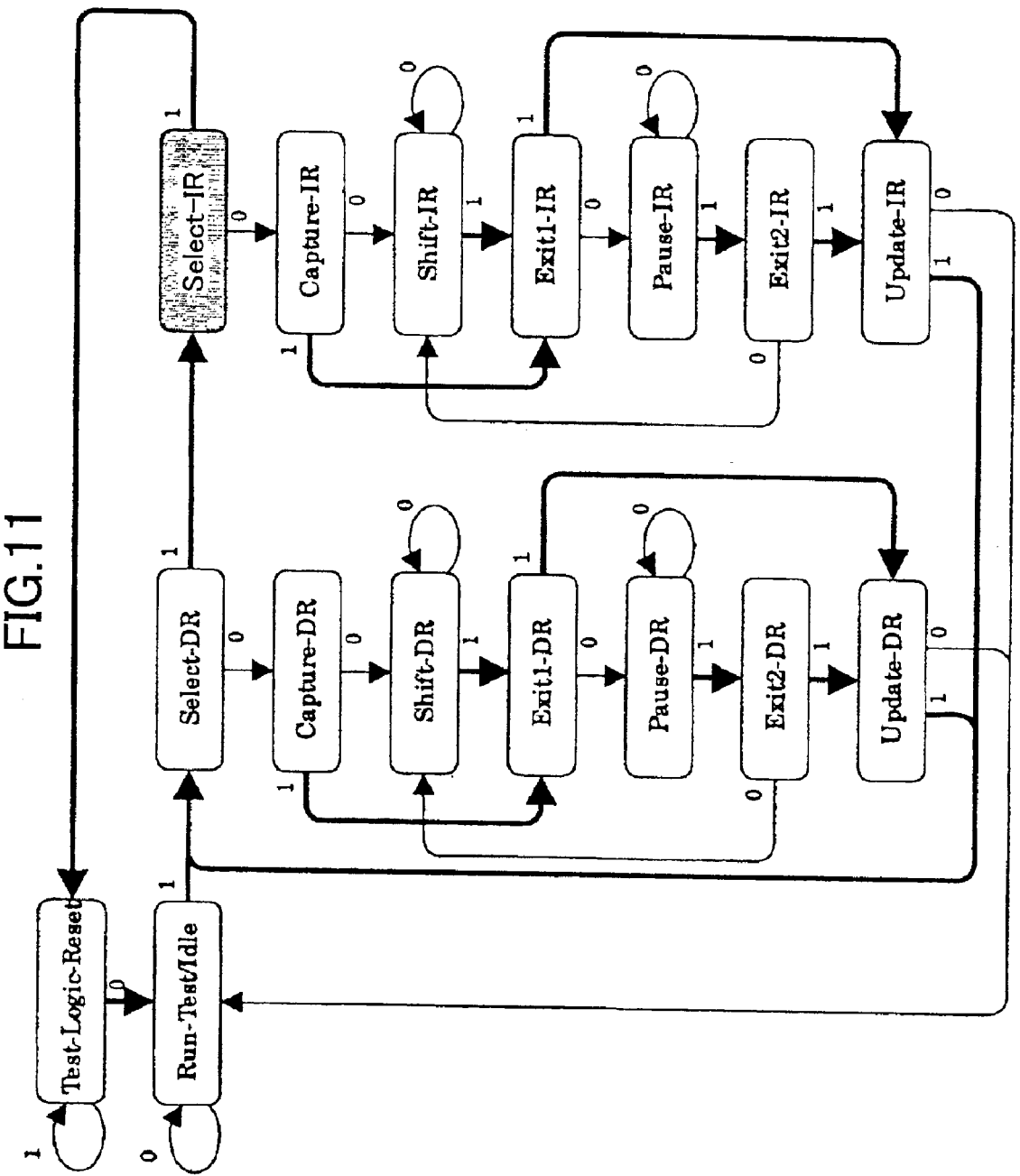
FIG. 11 shows the transition route for a fourth objective state.
Figure 12:
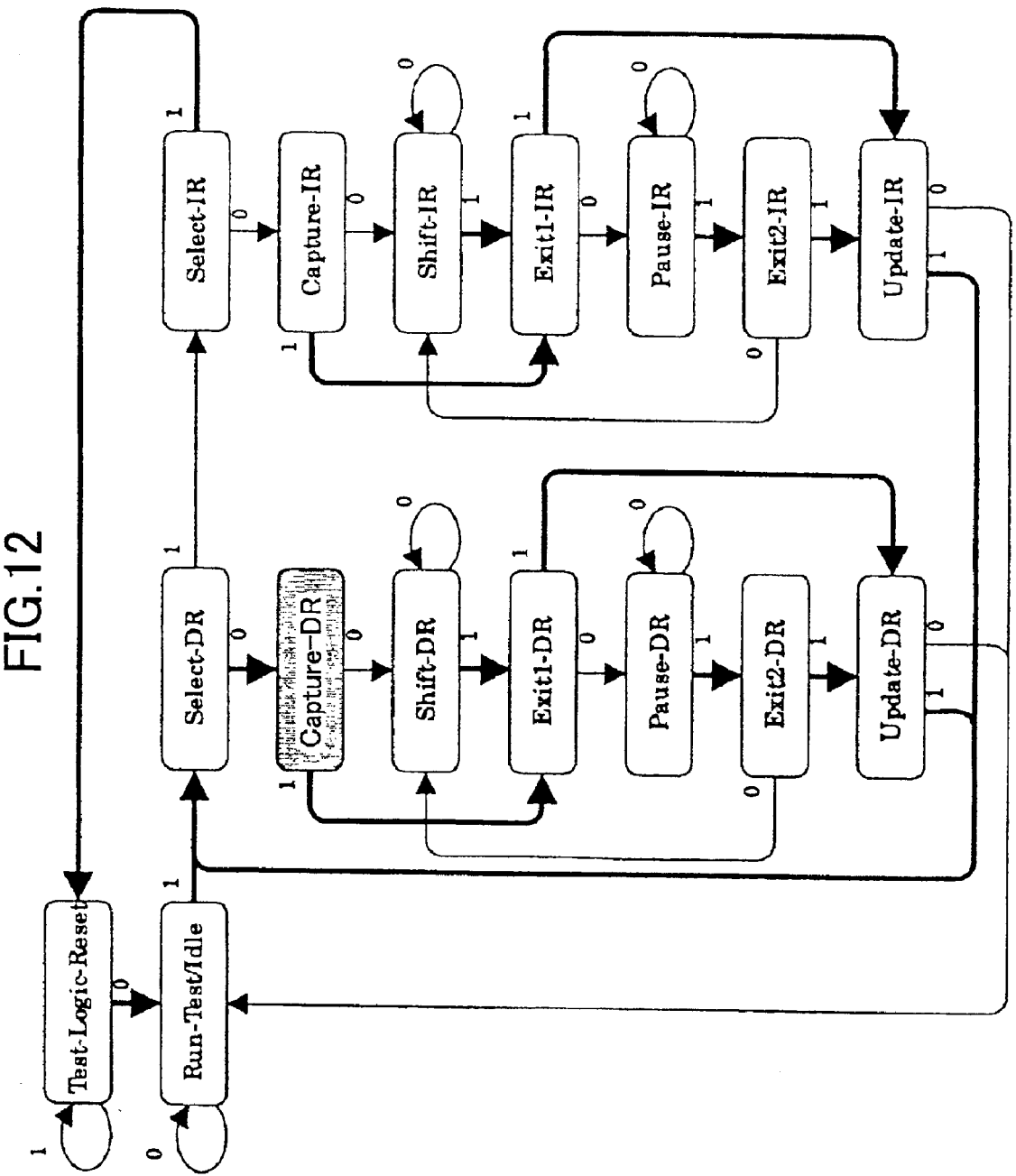
FIG. 12 shows the transition route for a fifth objective state.
Figure 13:
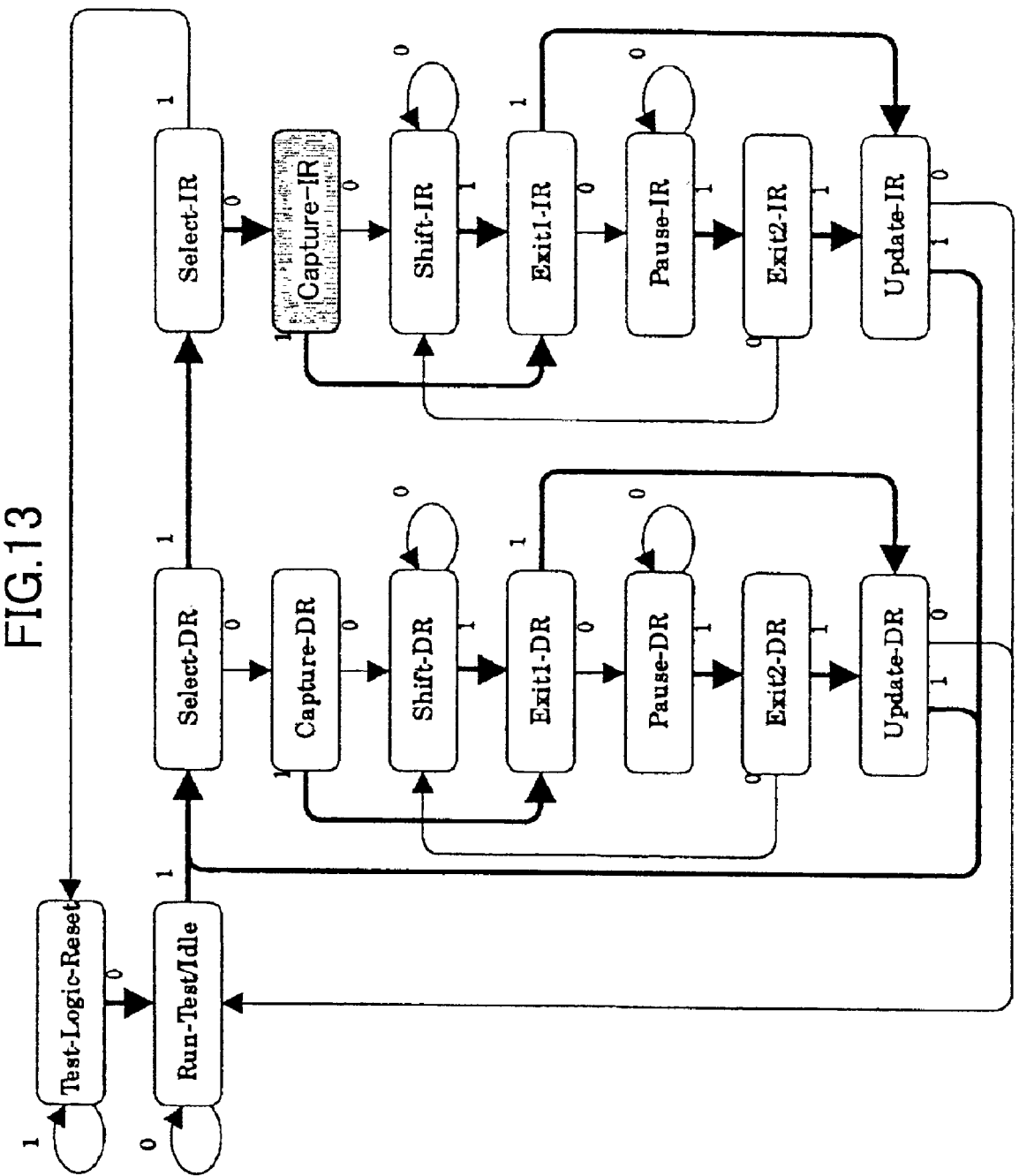
FIG. 13 shows the transition route for a sixth objective state.
Figure 14:
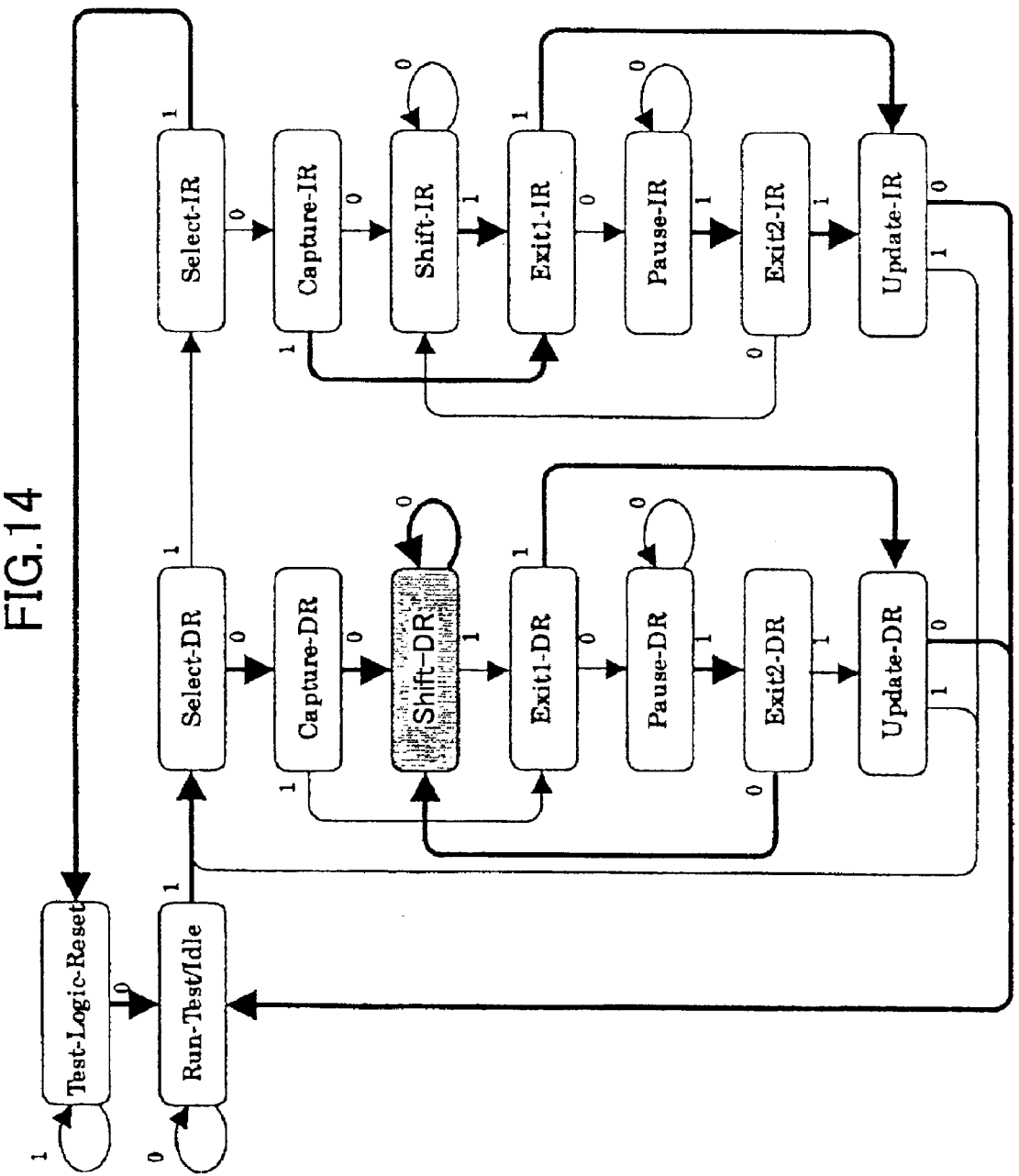
FIG. 14 shows the transition route for a seventh objective state.
Figure 15:
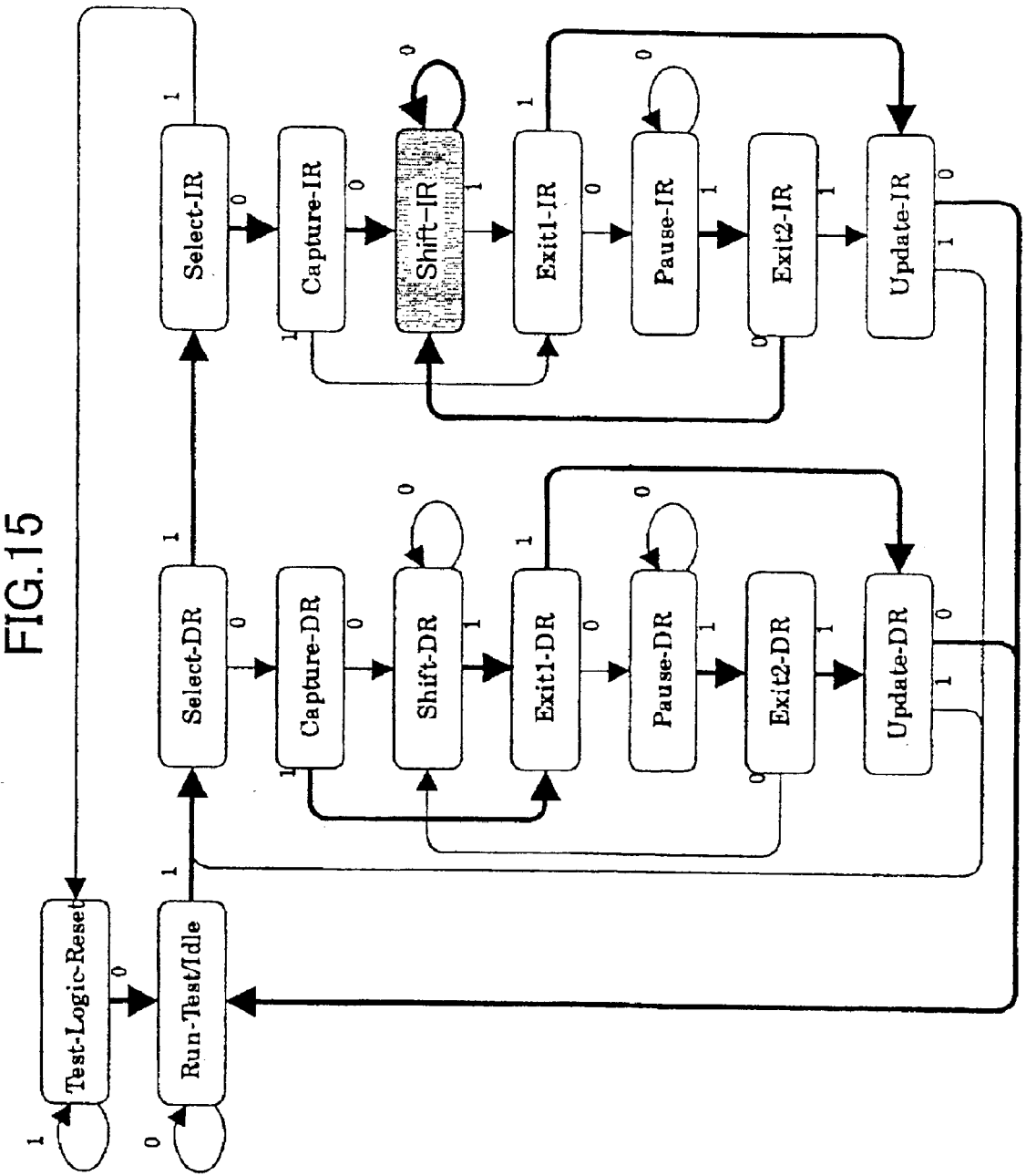
FIG. 15 shows the transition route for an eighth objective state.
Figure 16:
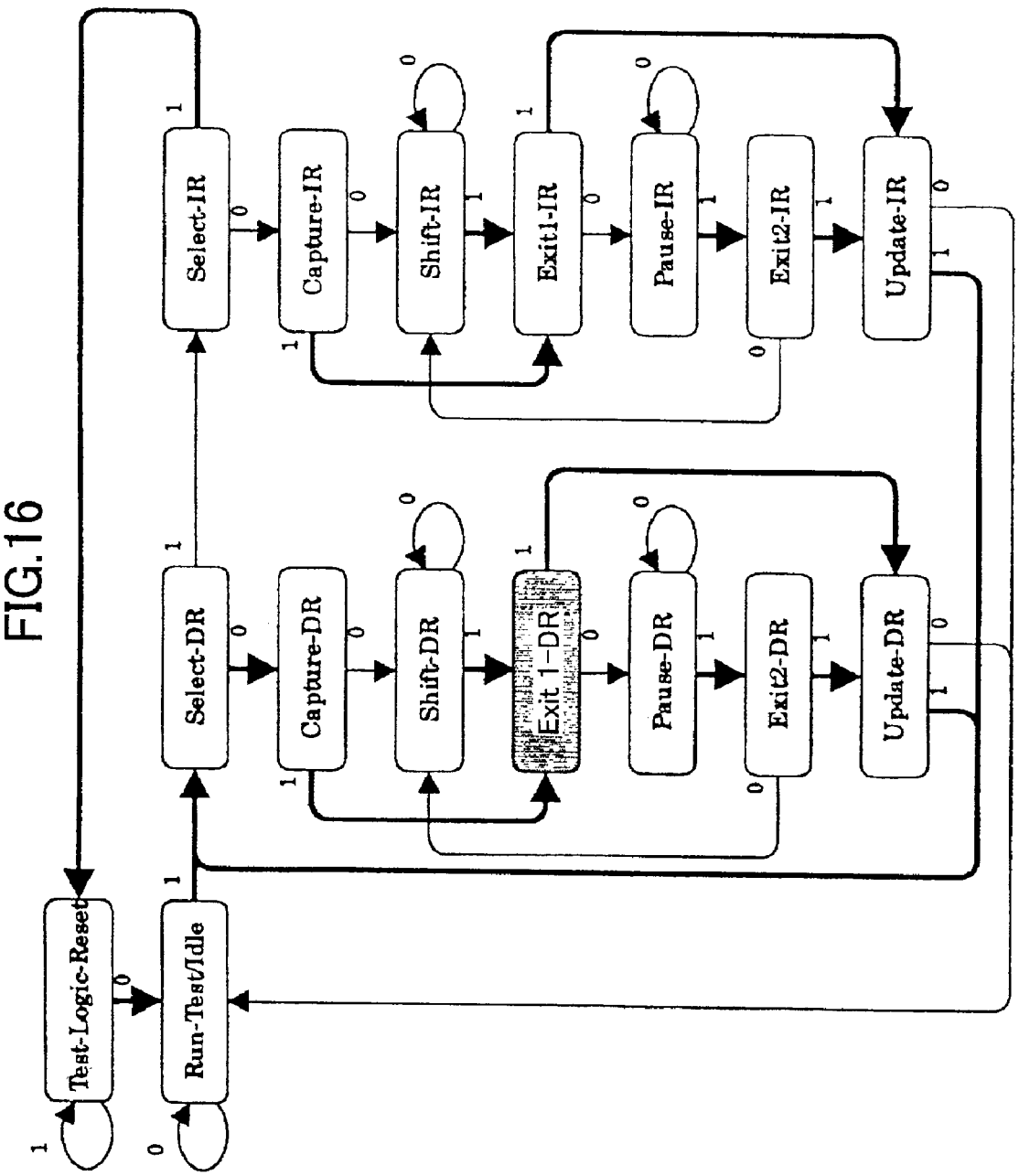
FIG. 16 shows the transition route for a ninth objective state.
Figure 17:
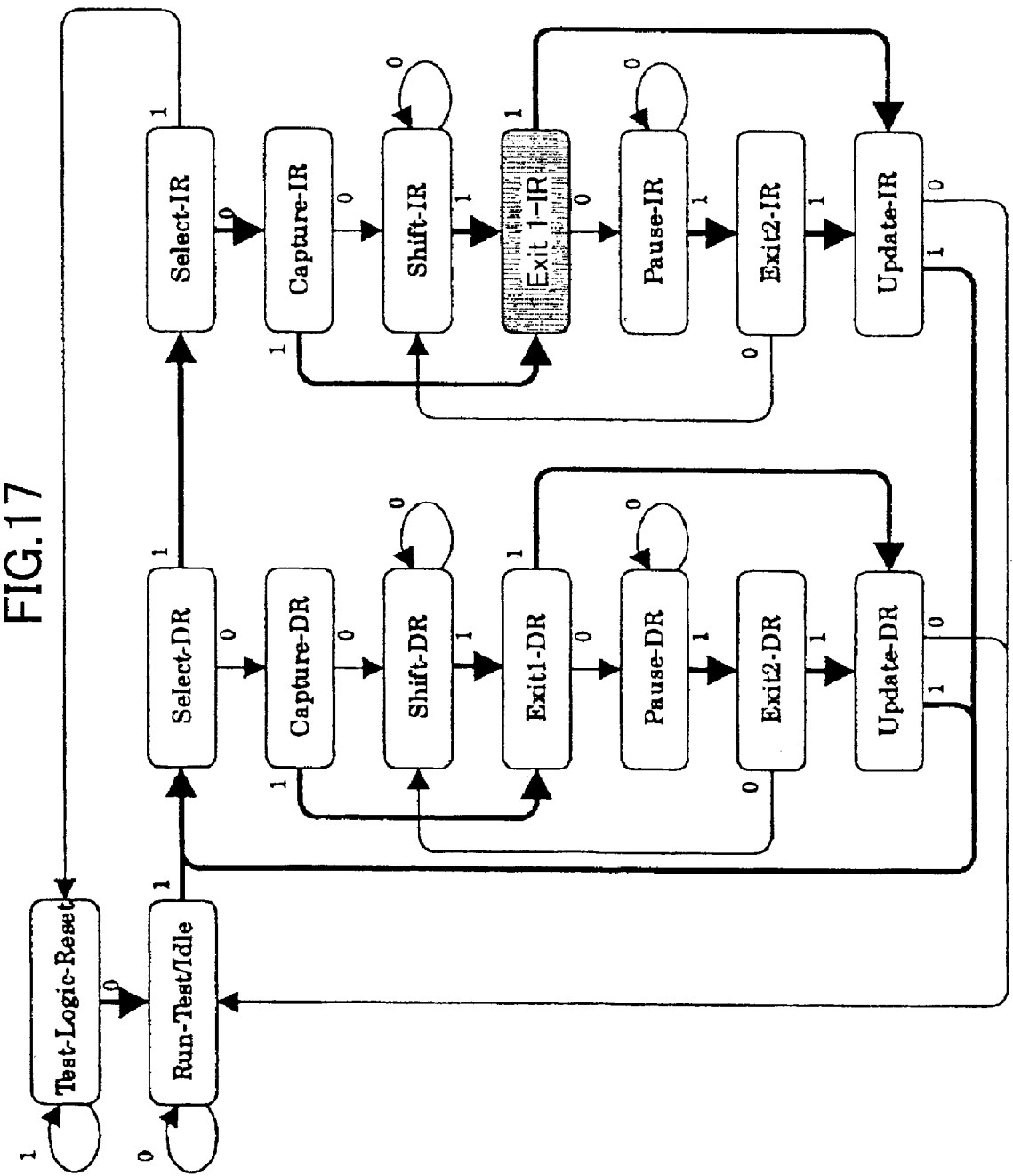
FIG. 17 shows the transition route for a tenth objective state.
Figure 18:
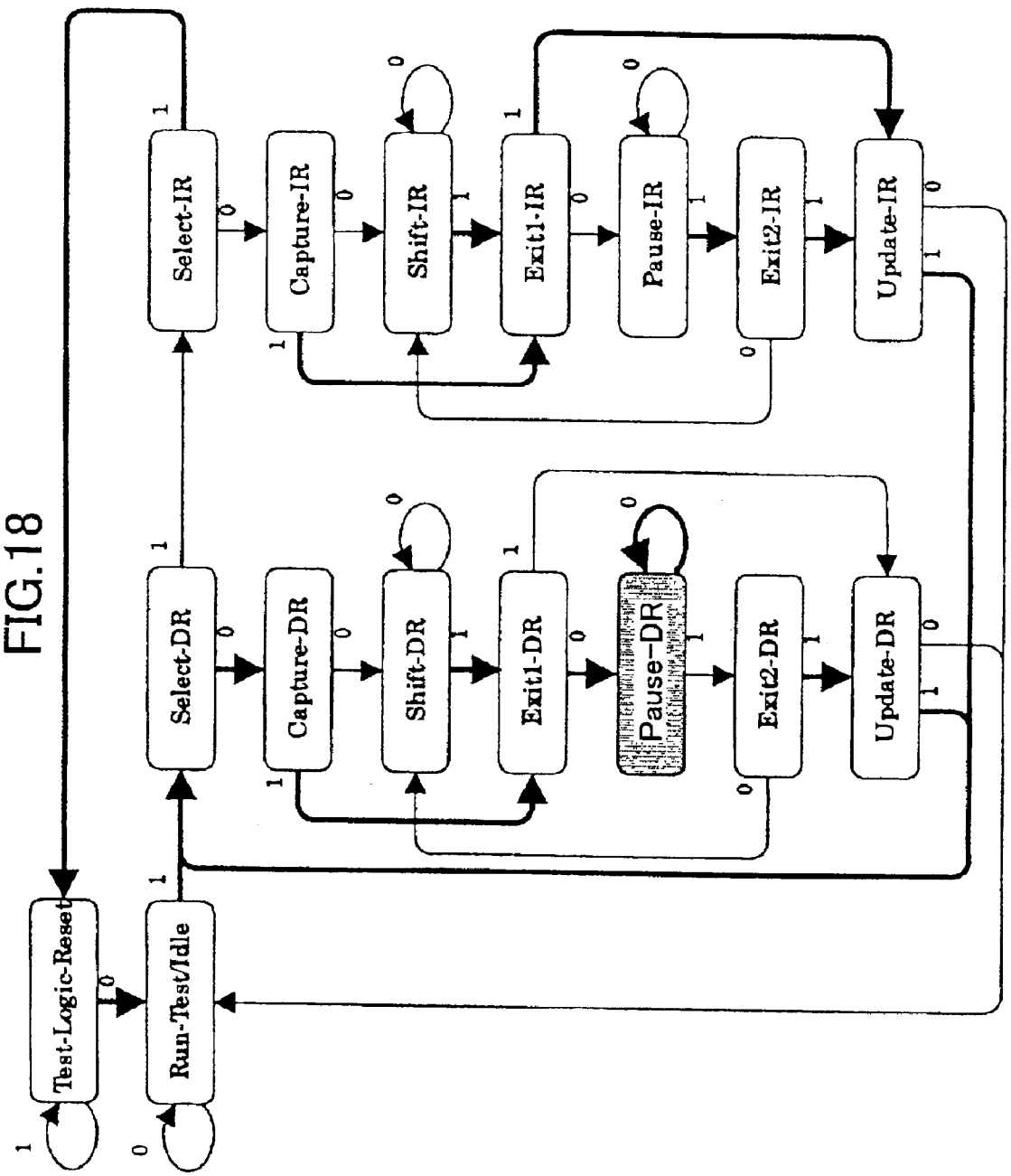
FIG. 18 shows the transition route for an eleventh objective state.
Figure 19:
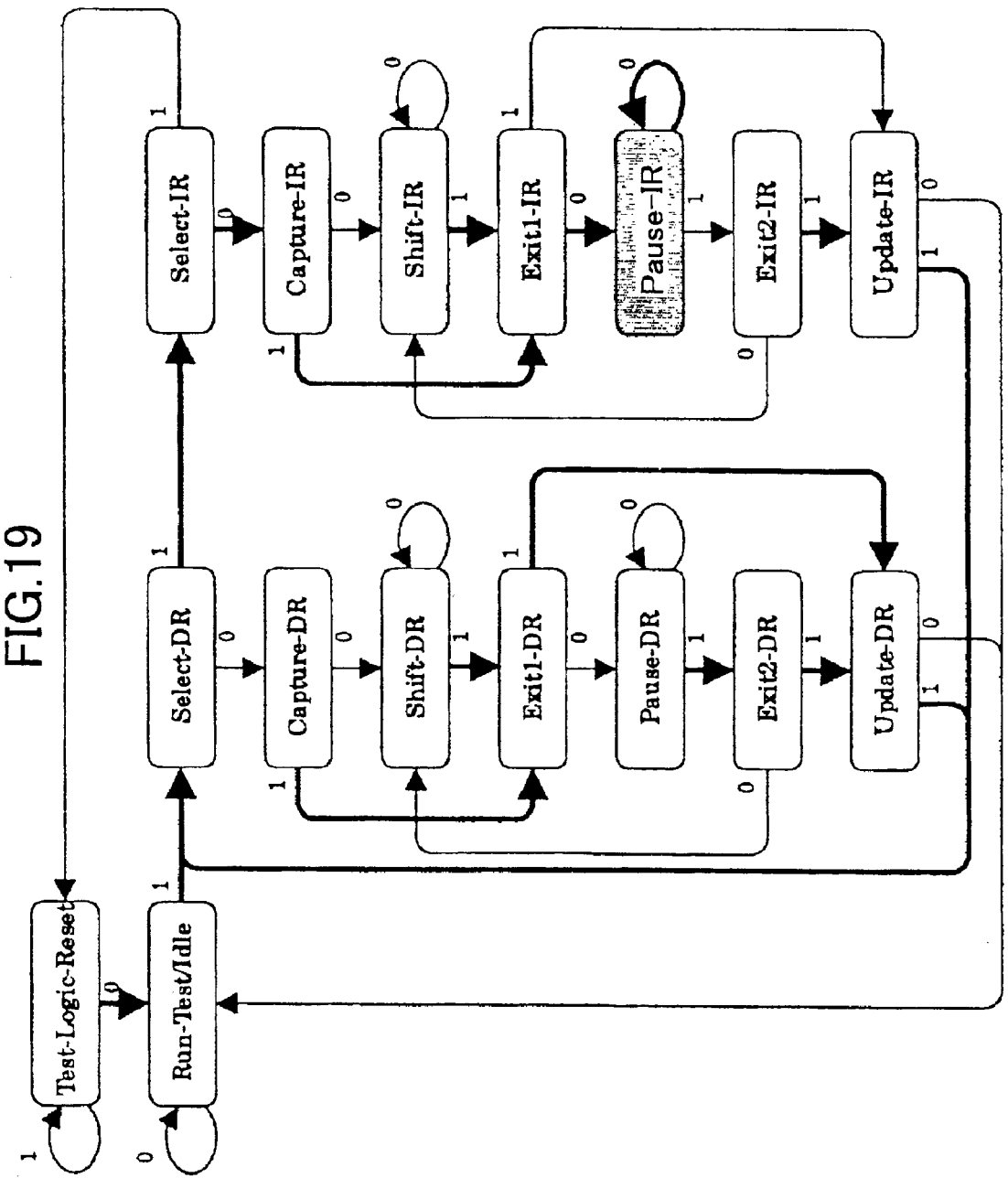
FIG. 19 shows the transition route for a twelfth objective state.
Figure 20:
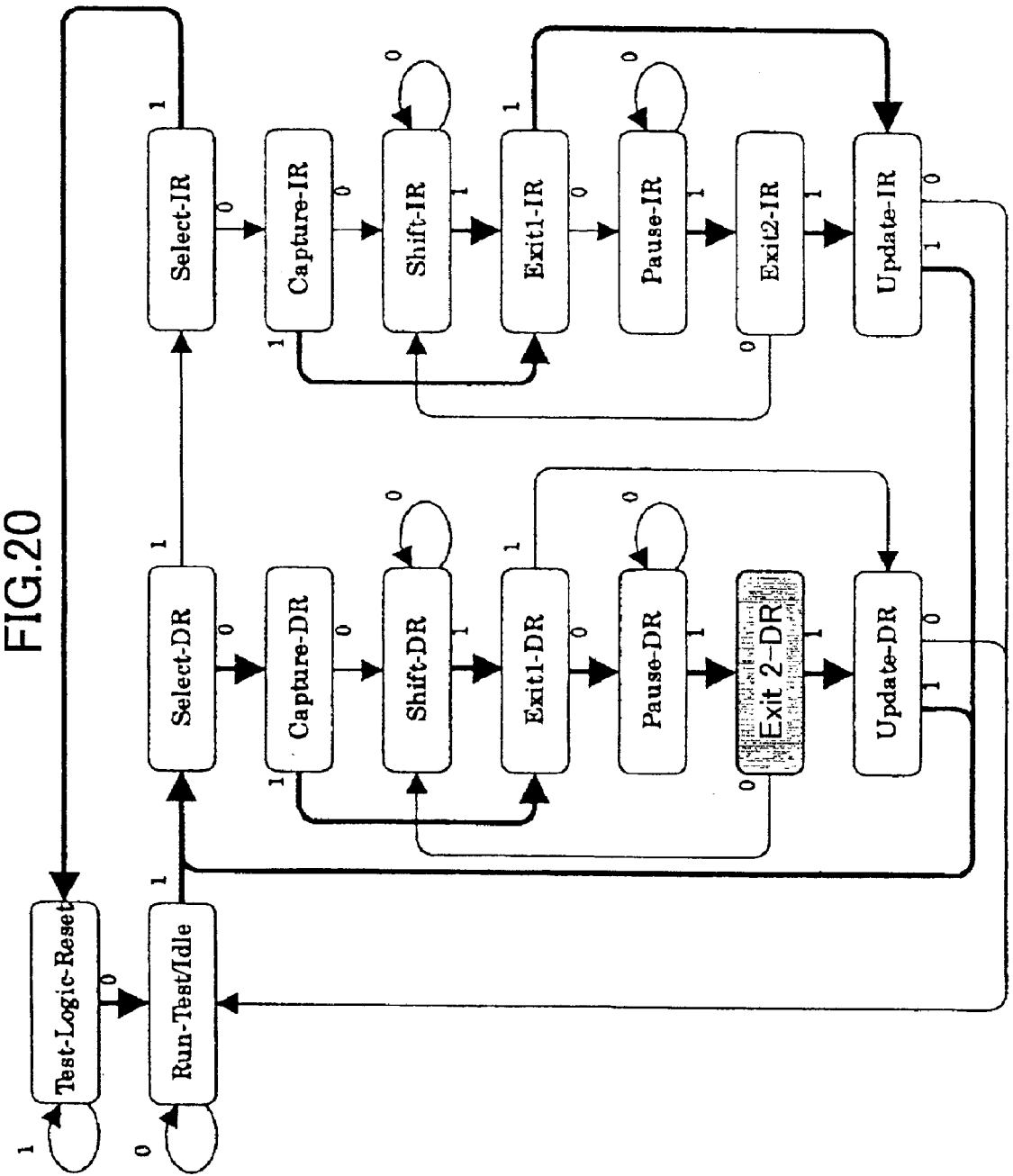
FIG. 20 shows the transition route for a thirteenth objective state.
Figure 21:
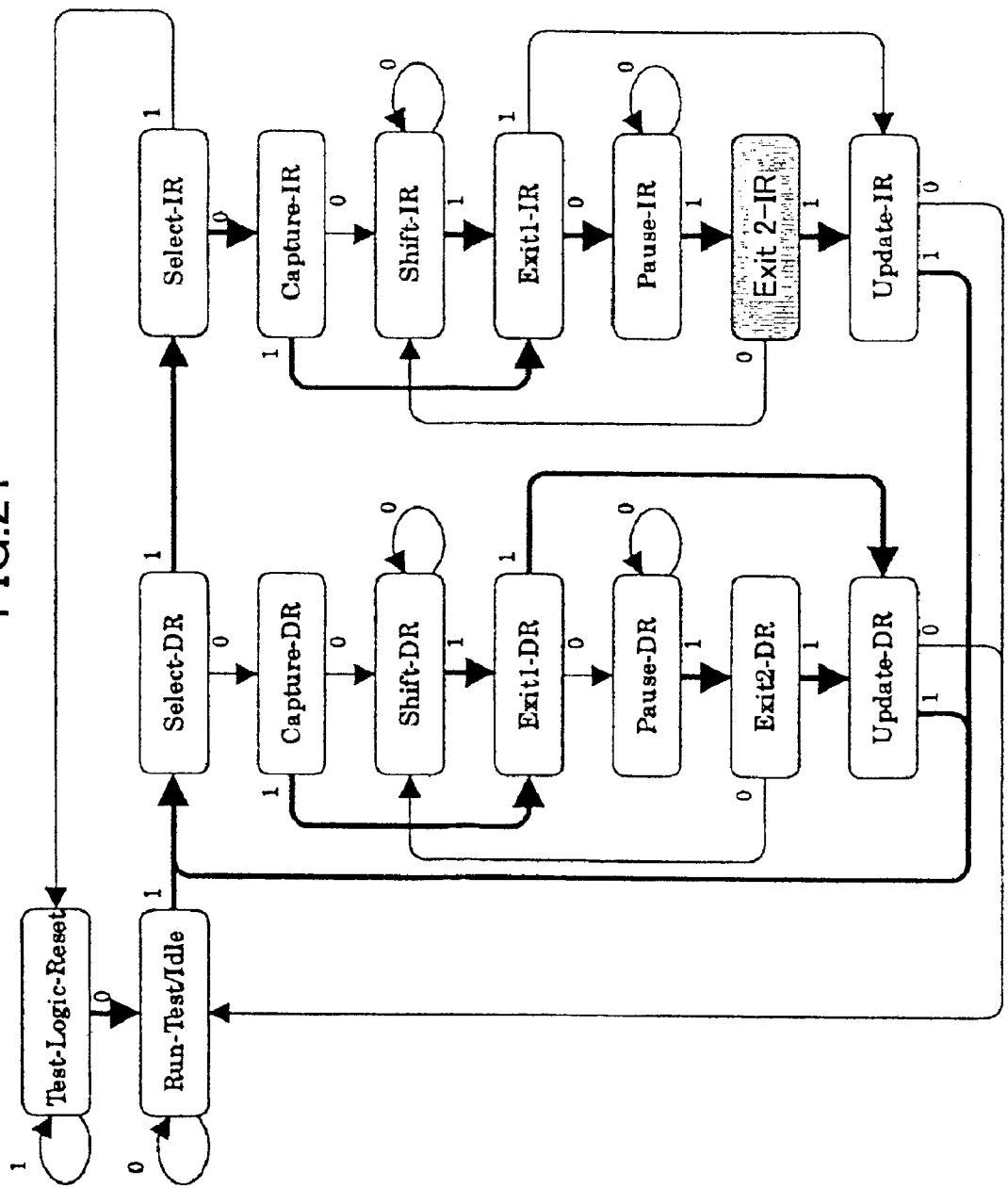
FIG. 21 shows the transition route for a fourteenth objective state.
Figure 22:
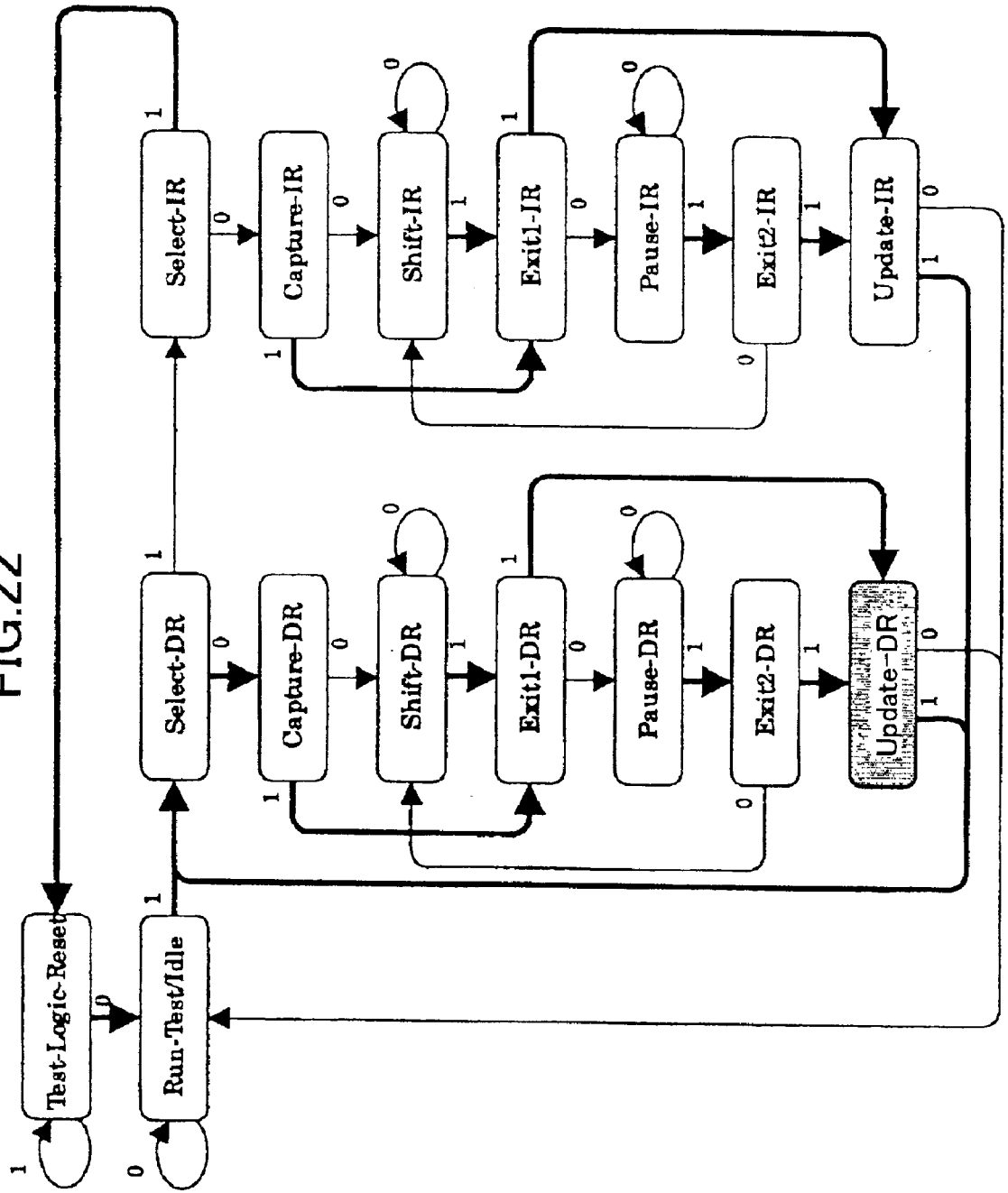
FIG. 22 shows the transition route for a fifteenth objective state.
Figure 23:
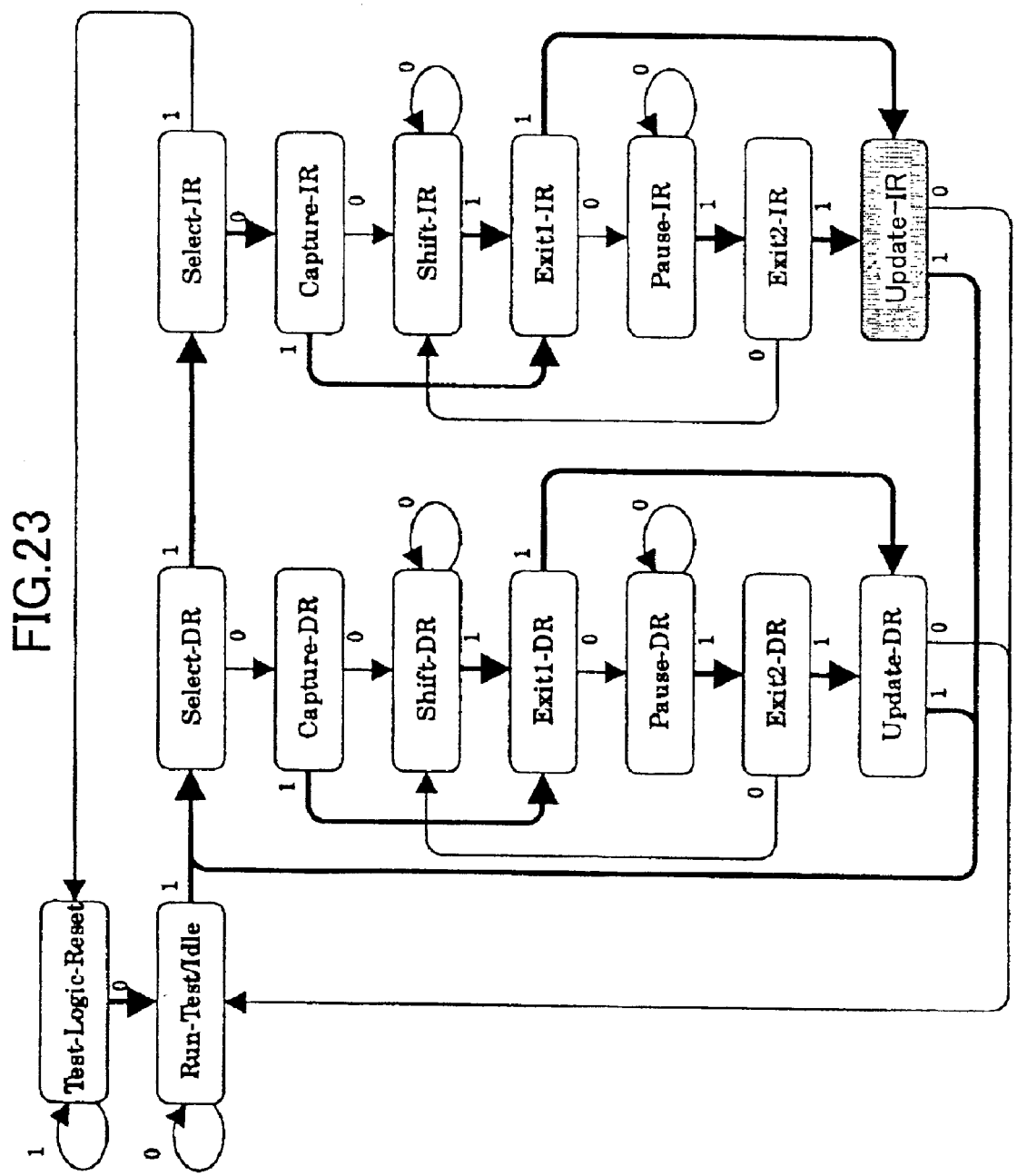
FIG. 23 shows the transition route for a sixteenth objective state.

FIGS. 8 through 23 show the transition route of each objective state. In each of FIGS. 8 through 23, the shadowed box is an objective state, and going through the bold line leads to the objective state. For instance, FIG. 8 shows a transition route in which Test-Logic-Reset is the objective state. If a Test-Logic-Reset command is again entered after the operation has reached the Test-Logic-Reset, the operation returns to the objective state.

Following the transition routes shown in FIGS. 8 through 23, the state control operation can be represented as Shift-Dr×n→Exit1-DR→Update-DR→Run-Test/Idle→Select-DR→Capture-DR→Shift-DR×n→Exit1-DR in this order, which is simply "Shift-DR×n→Exit1-DR"×m.

FIG. 24 shows command strings. In FIG. 24, the number of each command string, the Loop Count section, the Shift Count section, the GET flag, the SET flag, the Command Code section are shown in conjunction with the explanation of the operation of each command string. The combination of a shift command Exit1 and the Loop Count section or the Shift Count section can form an instruction for a complicated state control operation with a short command string.

The number 3 command string is written as a one-line command string, but the state switches from Shift-DR×16→Exit1-DR→Update-DR→Run-Test→Select-DR→Capture-DR→Shift-DR×16→Exit1-DR in this order, and ends in an Exit1-DR state.

The TDI and TDO data strings are arranged in words when going through an Update state, so that the data can be easily broken between commands. Accordingly, the software of the processor 13 that forms the command strings and data strings can easily perform operations.

FIG. 25 shows a TDI data string in which a word unit consists of 32 bits. FIG. 26 shows a TDO data string in which a word unit consists of 32 bits.

Figure 28:
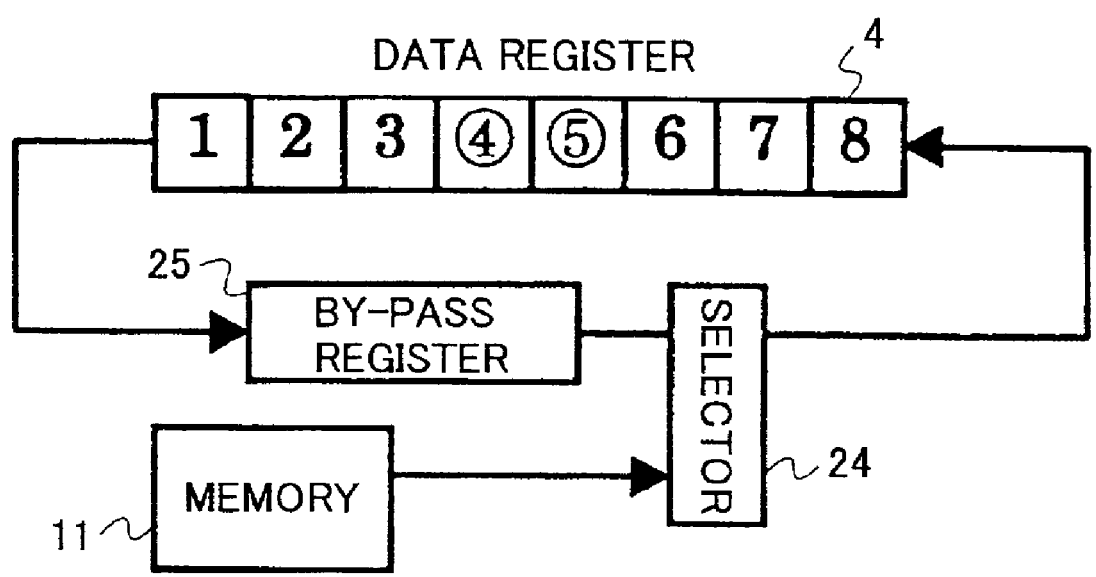
FIG. 28 is a circuit diagram showing an operation performed in the JTAG control circuit in a case where the command strings shown in FIG. 27 are used.

FIG. 27 shows a command string for rewrite a part of the bits in the data register 4 of the device shown in FIG. 1. FIG. 28 is a circuit diagram showing operations performed in the JTAG control circuit 12 when the command strings shown in FIG. 27. In FIG. 28, the same parts as in FIGS. 1, 3, and 6 are denoted by the same reference numerals, and explanations for those parts are omitted from this description. If the by-pass register 25 is 1-bit wide, when the command strings shown in FIG. 27 are executed, the data returned via the by-pass register 25 and the selector 24 are stored in the bits 1, 2, 3, 6, 7, and 8 in the data register 4, and the values set through the memory 11 are stored in the bits 4 and 5 in the data register 4.

FIG. 29 shows an operation performed by the instruction register 3 on the device side that is provided with an error check function so as to increase the reliability of the access control operation (the JTAG control operations). When the instruction register 3 provided with the error check function is captured, the bits ST0 and ST1 are read out. If there is a problem in the setting of the instruction register 3 upon execution of Update-IR, such as a parity error or an undefined operation code, "1" is set in the bit ST0. If there is a problem in the setting of the data register 4 upon execution of Update-DR, such as a data parity error or a bit length error, "1" is set in the bit ST1. By following the access procedures of setting of the instruction register 3→accessing the data register 4→reading the instruction register 3, it can be checked whether or not the setting of the instruction register 3 and the access to the data register 4 are properly completed when the instruction register 3 is read out.

The JTAG control circuit 12 is provided with a function that checks the bits ST0 and ST1 when the instruction register 3 is read, and also conducts a parity check. If an error is detected, the JTAG control circuit 12 stops the operation. With this JTAG control circuit 12, even if an error occurs in the middle of a long command sequence, the command sequence can be stopped.

FIG. 30 shows an operation performed by the instruction register 3 in a case where a write instruction flag W and a read instruction flag R are provided in the operation code shown in FIG. 29. In general, when the operation passes through a Capture-DR state in the JTAG, the contents of a data register are stored in a shift register, and when the operation passes through an Update-DR state, the contents of the shift register are stored in the data register. However, a data register might perform only read operations or write operations. In other words, a data register might restrict the updating when passing through an Update-DR state. In such a case, a flag W for instructing to write and a flag R for instructing to read are provided in the operation code in the instruction register 3, and accesses to be made in a Run-Test/Idle state, a Capture-DR state, and an Update-DR state are controlled. Thus, an access control operation can be easily performed with a simple instruction structure.

Figure 31:
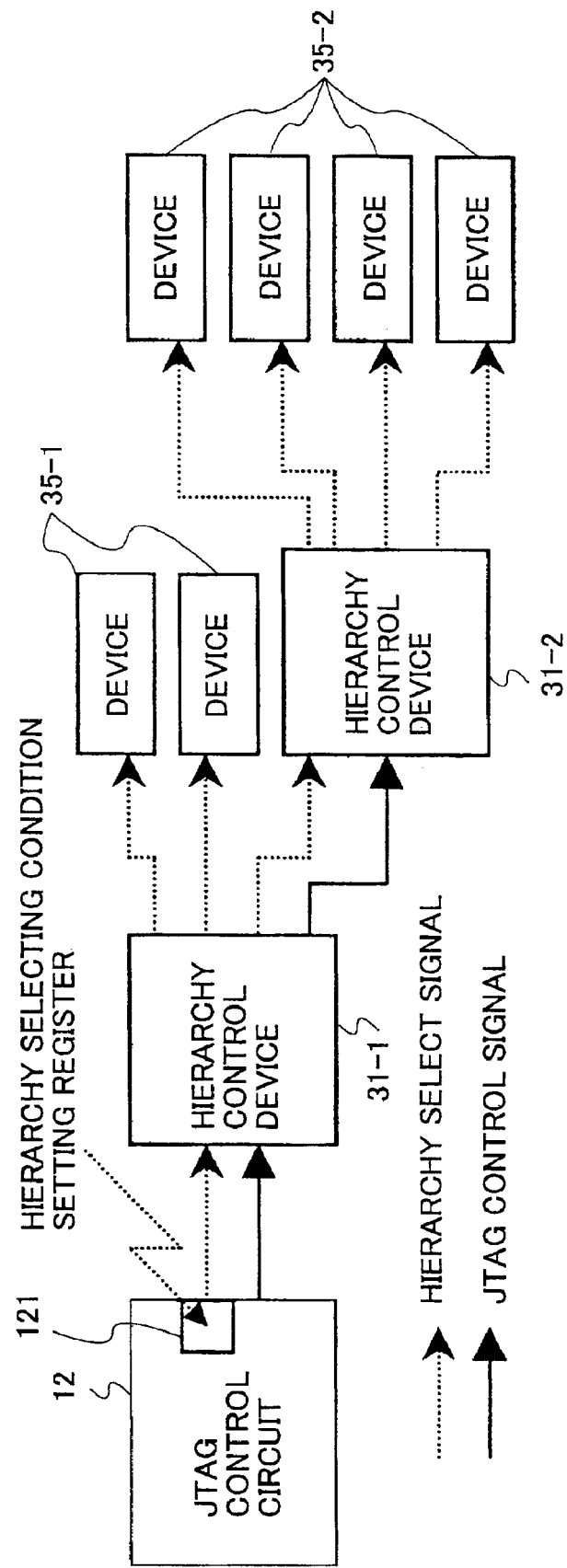
FIG. 31 is a block diagram showing the structure in which a plurality of JTAG devices are hierarchically arranged in such a manner that the JTAG control circuit has one-to-one correspondence with devices to be accessed in appearance.

FIG. 31 is a block diagram of a system structure in which a plurality of JTAG devices are hierarchically arranged in such a manner that the JTAG control circuit 12 has one-to-one correspondence with devices to be accessed in appearance. The JTAG control circuit 12 is connected to devices 35-1 of a predetermined hierarchy via a hierarchy control device 31-1, and is also connected to devices 35-2 of the next hierarchy via the hierarchy control device 31-1 and another hierarchy control device 31-2. The hierarchy control devices 31-1 and 31-2 are parts of the access control device.

Figure 32:
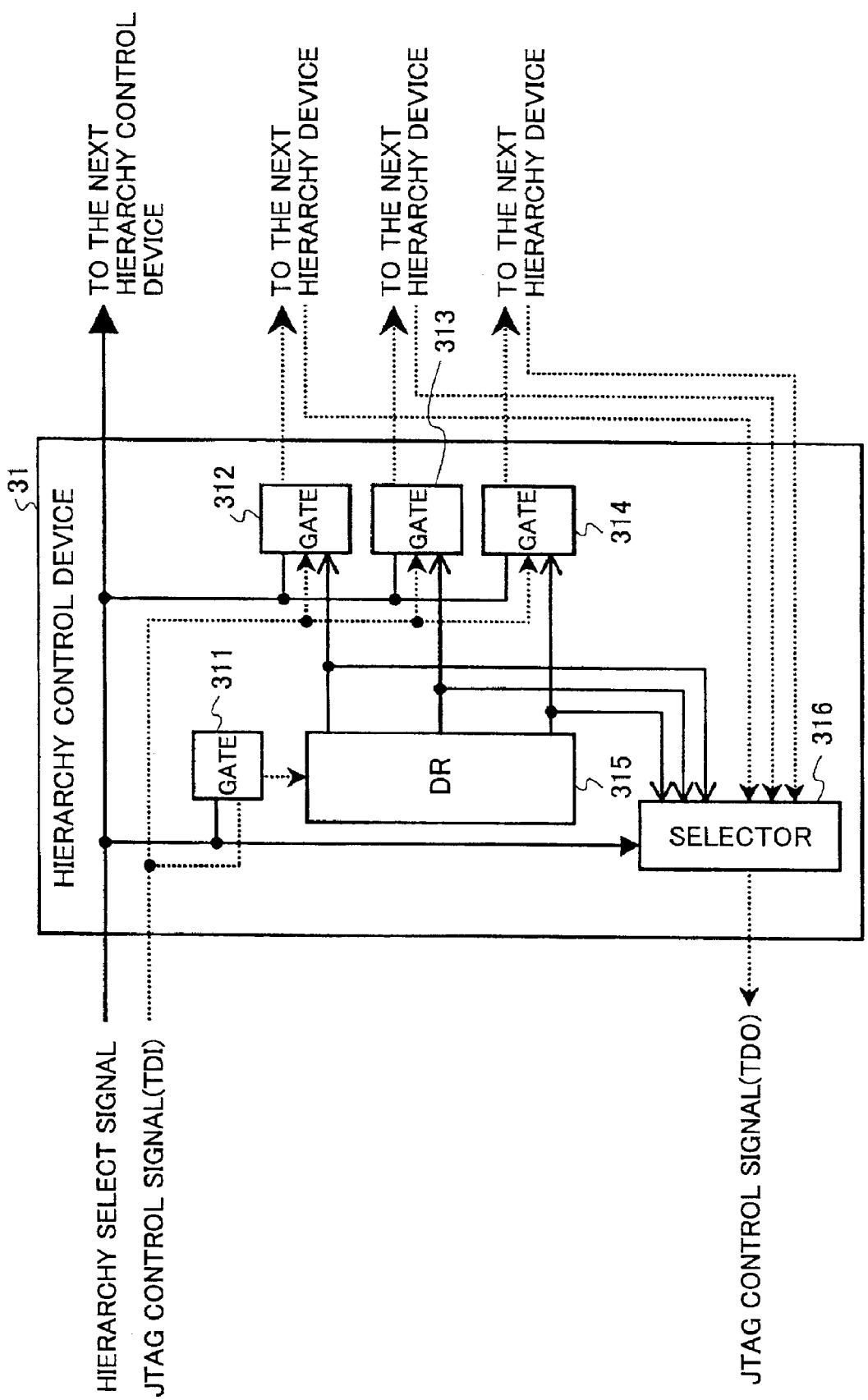
FIG. 32 is a block diagram showing the structure of the hierarchy control device shown in FIG. 31.

FIG. 32 is a block diagram of the structure of each hierarchy control device shown in FIG. 31. A hierarchy control device 31 includes gates 311 through 314 connected to one another, a device selecting register (DR) 315 and a selector 316. In addition to the regular JTAG control signals (TCK, TMS, TDI, and TDO signals), a hierarchy select signal for selecting which hierarchy is to be accessed is used.

In FIGS. 31 and 32, the flow of the regular JTAG control signals is shown by the dotted lines and arrows, and the flow of the hierarchy select signal is shown by the solid lines and arrows.

A regular JTAG access is made to the devices 35-2 of a selected hierarchy, and the JTAG control signal is supplied to the devices 35-2 via the devices 35-1 of one hierarchy above the selected hierarchy. The hierarchy control device 31-2 that controls the devices 35-2 of the lower hierarchy is provided with a data register 315, and a JTAG control operation is performed on devices 35-2 designated by the data register 315. A plurality of devices 35-2 are selected by the data register 315, so that data can be simultaneously supplied to the plurality of devices 35-2. However, since there is only one signal line for a TDO signal to be returned to the JTAG control circuit 12, one device is further selected from the devices 35-2 selected by the selector 316, and the TDO signal is returned to the hierarchy control device 31-1 of the upper hierarchy. The hierarchy control device 31-1 of the upper hierarchy in turn selects one device from the devices 35-2 selected by the selector 316, and returns the TDO signal to the JTAG control circuit 12.

FIG. 33 shows the command structure in a case where the command shown in FIG. 5 is extended and a hierarchy select signal can be set in the command sequence. As shown in FIG. 33, a hierarchy selecting condition is set at the bit locations "0" to "4", so that a control operation on devices subjected to hierarchy selection and device selection can be performed in one command sequence. The value set by the command, i.e., the hierarchy select signal is stored in the hierarchy selecting condition setting register 121 in the JTAG control circuit shown in FIG. 31.

Figure 34:
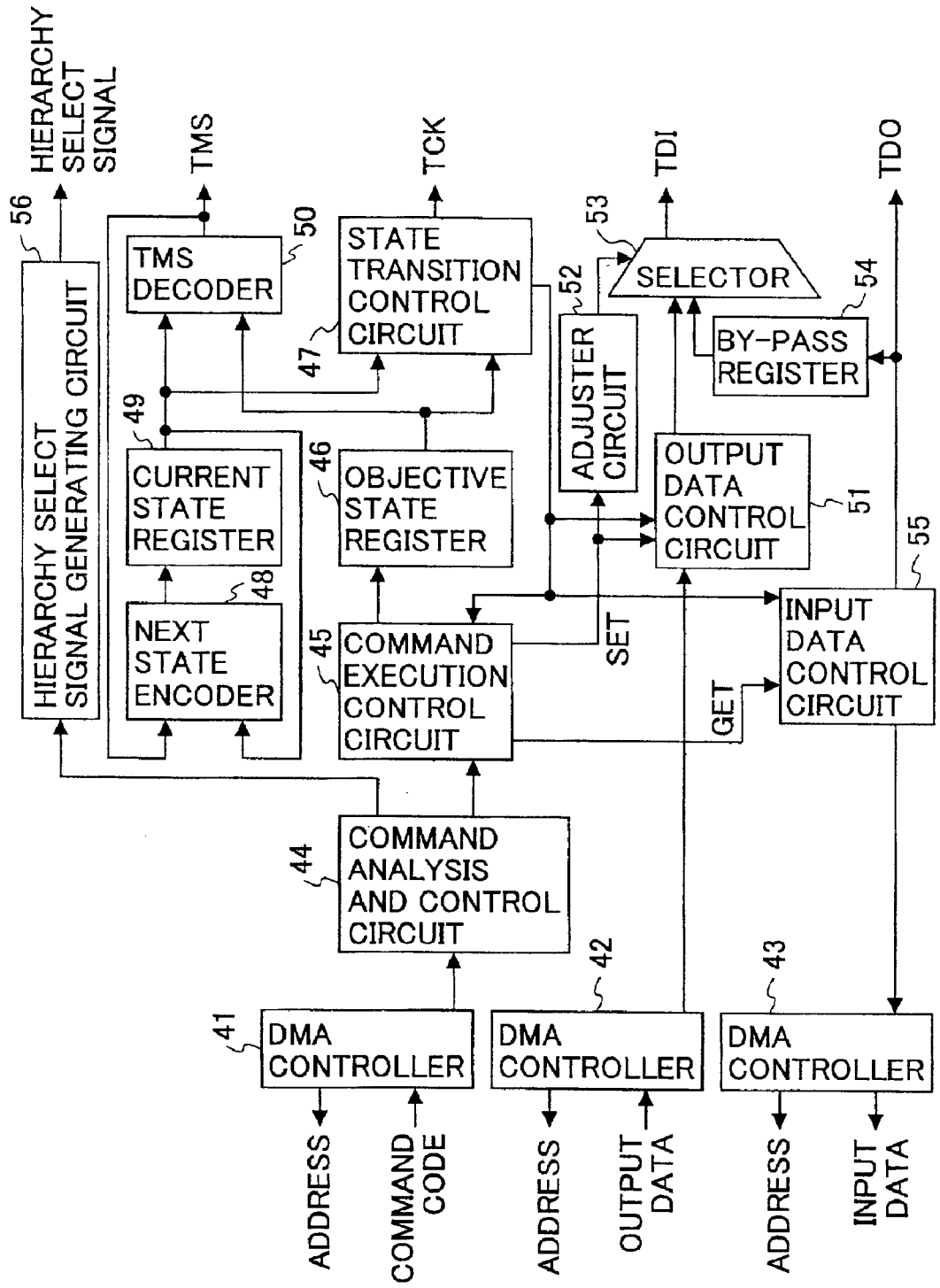
FIG. 34 is a block diagram showing an example of the structure of the JTAG control circuit.

FIG. 34 is a block diagram showing an example of the structure of the JTAG control circuit 12. The JTAG control circuit 12 includes DMA controllers 41 through 43, a command analysis and control circuit 44, a command execution control circuit 45, an objective state register 46, a state transition control circuit 47, a next state encoder 48, a current state register 49, a TMS decoder 50, an output data control circuit 51, an adjusting circuit 52, a selector 53, a by-pass register 54, an input data control circuit 55, and a hierarchy select signal generating circuit 56.

The command analysis and control circuit 44 sequentially reads out a command (or a command code) from a designated address in the memory 11 via the DMA controller 41, and activates the command execution control circuit 45. In accordance with the contents of the command, the command execution control circuit 45 sets an objective state in the objective state register 46, and then activates the state transition control circuit 47. The command execution control circuit 45 also supplies a SET flag to the output control circuit 51 and the adjusting circuit 52, and supplies a GET flag to the input data control circuit 55. The state transition control circuit 47 generates a TCK signal until the contents of the current state register 49 matches with the contents of the objective state register 46. The next state encoder 48 encodes a next state, and then sets the encoded state in the current state register 49. From the current state register 49 and the objective state register 46, the TMS decoder 50 determines the value of a TMS signal to be next generated.

The output data control circuit 51 obtains data to be outputted from a designated address in the memory 11 via the DMA controller 42, and outputs the data to the selector 53 in a Shift state in which the SET flag is set by the command. The selector 53 receives the SET flag of the command via the adjusting circuit 52, and, based on the SET flag, selectively outputs the data supplied from the output data control circuit 51 or the data of a TDO signal obtained via the by-pass register 54, as a TDI signal.

The input control circuit 55 obtains the data of the TDO signal in a Shift state in which the GET flag is set by the command, and writes the data in the memory 11 at a designated address via the DMA controller 43.

Based on the analysis results of an extended command (such as the extended command shown in FIG. 33) analyzed by the command and control circuit 44, the hierarchy select signal generating circuit 56 generates a hierarchy select signal to be used for testing or diagnosing a device having a hierarchical structure described above in conjunction with FIGS. 31 and 32. The generated hierarchy select signal is then set inn the hierarchy select condition setting register 121 in the JTAG control circuit 12 shown in FIG. 31. The hierarchy select signal generating circuit 56 is not necessary for testing or diagnosing a device not having a hierarchical structure.

Figure 35:
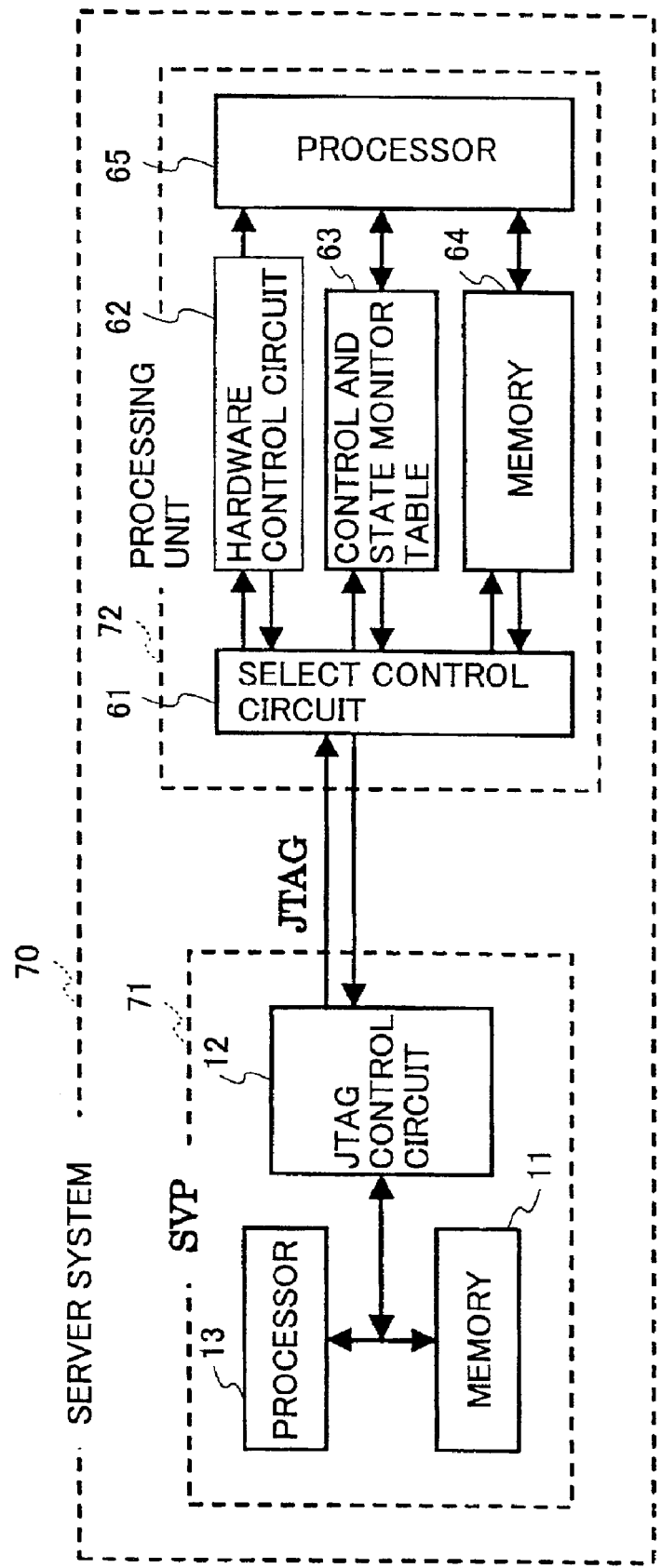
FIG. 35 is a block diagram of a server system to which the present invention is applied.
Figure 36:
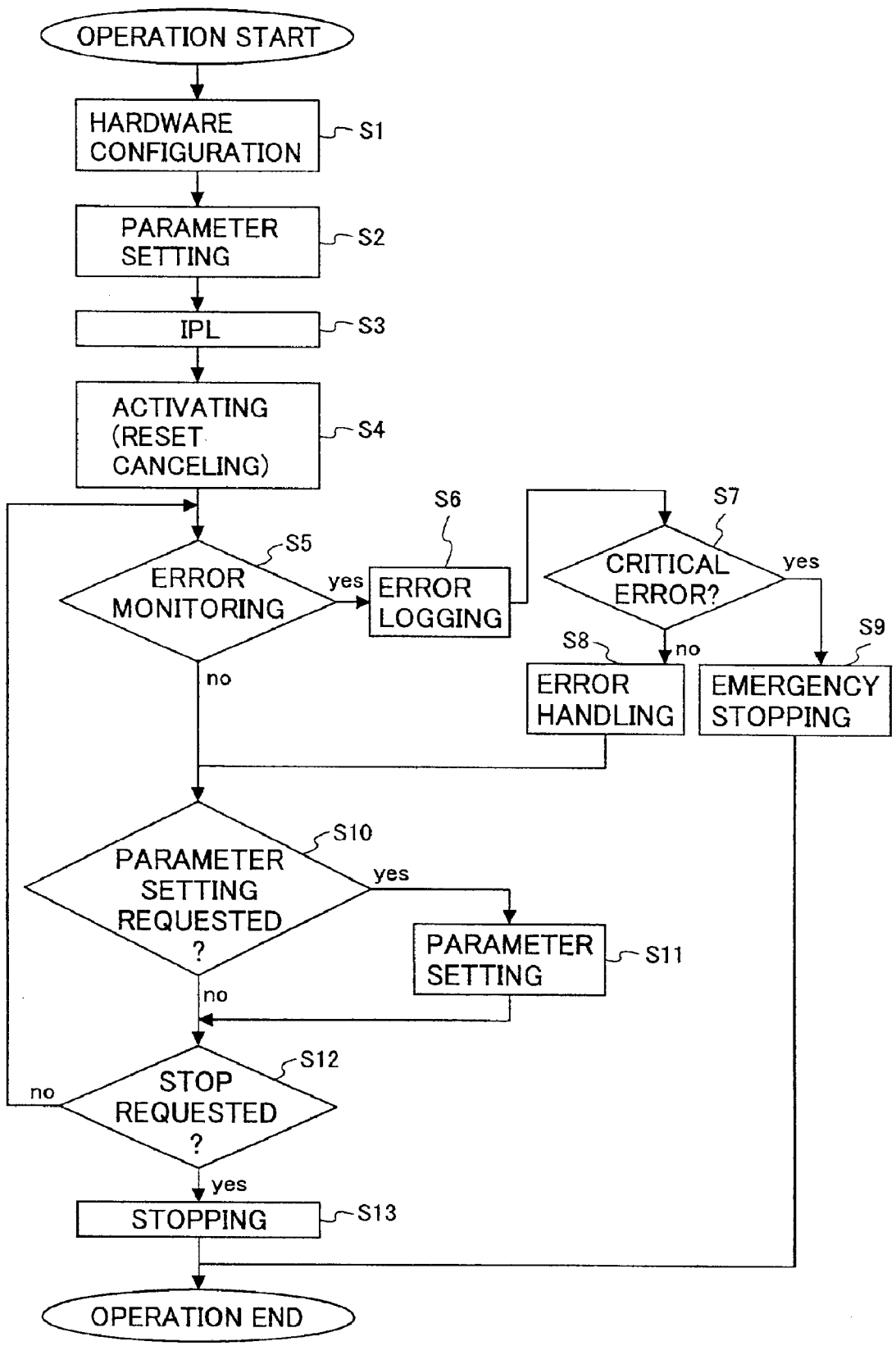
FIG. 36 is a flowchart of an operation performed by the service processor in the server system shown in FIG. 35.

Referring now to FIGS. 35 and 36, a case where the above embodiment of the present invention is applied to a server system will be described. FIG. 35 is a block diagram of the server system to which the above embodiment of the present invention is applied. In FIG. 35, the same parts as shown in FIG. 33 are denoted by the same reference numerals, and explanation of those parts will be omitted. FIG. 36 is a flowchart of an operation of a service processor (SVP) in the server system shown in FIG. 35.

In FIG. 35, the server system 70 includes a service processor 71 and a processing unit 72. The service processor 71 includes a memory 11, a JTAG control circuit 12, and a processor 13. Meanwhile, the processing unit 72 to be diagnosed or controlled includes a select control circuit 61, a hardware control circuit 62, a control and state monitor table 63, a memory 64, and a processor 65 formed by a CPU or the like.

The functions of the hardware control circuit 62 include the following:
A1) Interpreting a JTAG command, and switching on and off a reset signal and an interrupt signal for the processor 65.
A2) Supplying a JTAG command to the processor 65, so that the service processor 71 can conduct a boundary scan on the processor 65 so as to diagnose the hardware.
A3) Supplying a JTAG command to the processor 65, so that the FPGA of the processor 65 can be configured.

The functions of the control and state monitor table 63 include the following:
B1) Providing a group of registers that can be controlled by the JTAG in the processing unit 72, thereby setting a mode in the hardware or in the firmware of the processor 65.
B2) Reading out an error signal and a status detected by the hardware or the firmware of the processor 65, and monitoring an error and processing situations.
B3) Providing a group of registers that can be accessed by the JTAG and the processor 65, and establishing a communication environment with the software of the processor 65, so that a mode setting operation can be performed on the software, and that an error or a status can be obtained.

The functions of the memory 64 include the following:
C1) Storing a program to be executed by the processor 65.
C2) reading out information such as log information stored by the program of the processor 65, so as to monitor the operation by the program.
C3) Forming a mailbox for the service application (SVA) and the program of the processor 65, thereby establishing a communication environment between programs.

The JTAG control signals are transmitted between the service processor 71 and the processing unit 72. In the server system 70 shown in FIG. 35, the service processor 71 that controls the basic operations of the processing unit 72 is provided with a JTAG control function so as to control and monitor the processing unit 72 through the JTAG interface.

In this structure, the service processor 71 performs basic operations on the hardware control circuit 62, such as resetting the processing unit 72, via the select control circuit 61. As for the control and state monitor table 63, the service processor 71 performs operations, such as a parameter setting operation and an error information collecting and controlling operation on the processor 65, via the select control circuit 61. As for the memory 64 that stores programs, the service processor 71 performs operations, such as initial loading of a program to be used in the processing unit 72 and data transferring operations, via the select control circuit 61.

Being able to perform high-speed operations, the JTAG control circuit 12 in the service processor 71 is particularly effective in accessing a large volume of data, such as the data in the memory 64. An operation can be performed on the software of the service processor 71 in such a manner that it appears as if a block transfer were conducted from the memory 11 in the service processor 71 to the memory 64 in the processing unit 72.

Referring to FIG. 36, a hardware configuration operation is performed on the hardware control circuit 62 in step S1. In step S2, a parameter setting operation is performed. In the hardware configuration operation, a programmable device such as a FPGA is configured. In the parameter setting operation, a hardware operation mode setting and a firmware operation mode setting are performed, as well as a software operation mode setting. In step S3, an initial program loading operation is performed. In step S4, the processing unit 72 is activated (reset canceling). In the initial program loading operation, a program to be used in the processor 65 is stored in the memory 64. In the activation of the processing unit 72, a reset canceling operation and an activating signal transmitting operation are performed on the processor 65 so as to start the operation of the processor 65. In step S5, an error monitoring operation is performed to determine whether an error has been detected. In the error monitoring operation, a hardware error and a software error are monitored with reference to the control and state monitor table 63.

If the result of step S5 is YES, an error logging operation is performed in step S6. In step S7, it is determined whether a detected error is a critical error. If the result of step S7 is NO, an error handling operation is performed in step S8, and the operation moves on to step S10. On the other hand, if the result of step S7 is YES, an emergency stop operation is performed on the processing unit 72, and the entire operation comes to an end.

If the result of step S5 is NO, or after step S8, it is determined whether a parameter setting request has been issued in step S10. If the result of step S10 is YES, a parameter setting operation is performed in step S11, and the operation moves on to step S12. In the parameter setting operation, a new parameter is set when there is a parameter setting request from the processor 65 or an operator outside the service processor 71. In step S12, it is determined whether the request is a stop request. If the result of step S12 is NO, the operation returns to step S5. If the result of step S12 is YES, a stop (reset) operation is performed on the server system 70, and the entire operation comes to an end. In the stop operation, a system stop operation, such as resetting, is performed when a stop request for the server system 70 is made by an operator.

Where a JTAG control signal is used for the service processor interface in the server system 70, designing and testing can be efficiently conducted, because the interface is standardized with a small number of lines. Also, where the processing unit 72 includes JTAG devices, it is possible to perform a boundary scan, though the processing unit 72 is incorporated into the server system 70. With this structure, the hardware in the server system 70 can be diagnosed without a testing device such as a printed wiring board tensing device. In this manner, a diagnosis function and regular system control and monitor functions can be realized with one interface.

Where a FPGA in accordance with the JTAG is used, the FPGA can be configured by the service processor 71, and, therefore, there is no need to employ a ROM for configuring the FPGA. Even if a ROM is used, the ROM can be rewritten with the JTAG. Thus, smooth operations can be performed after the incorporation into the server system 70.

Figure 37:
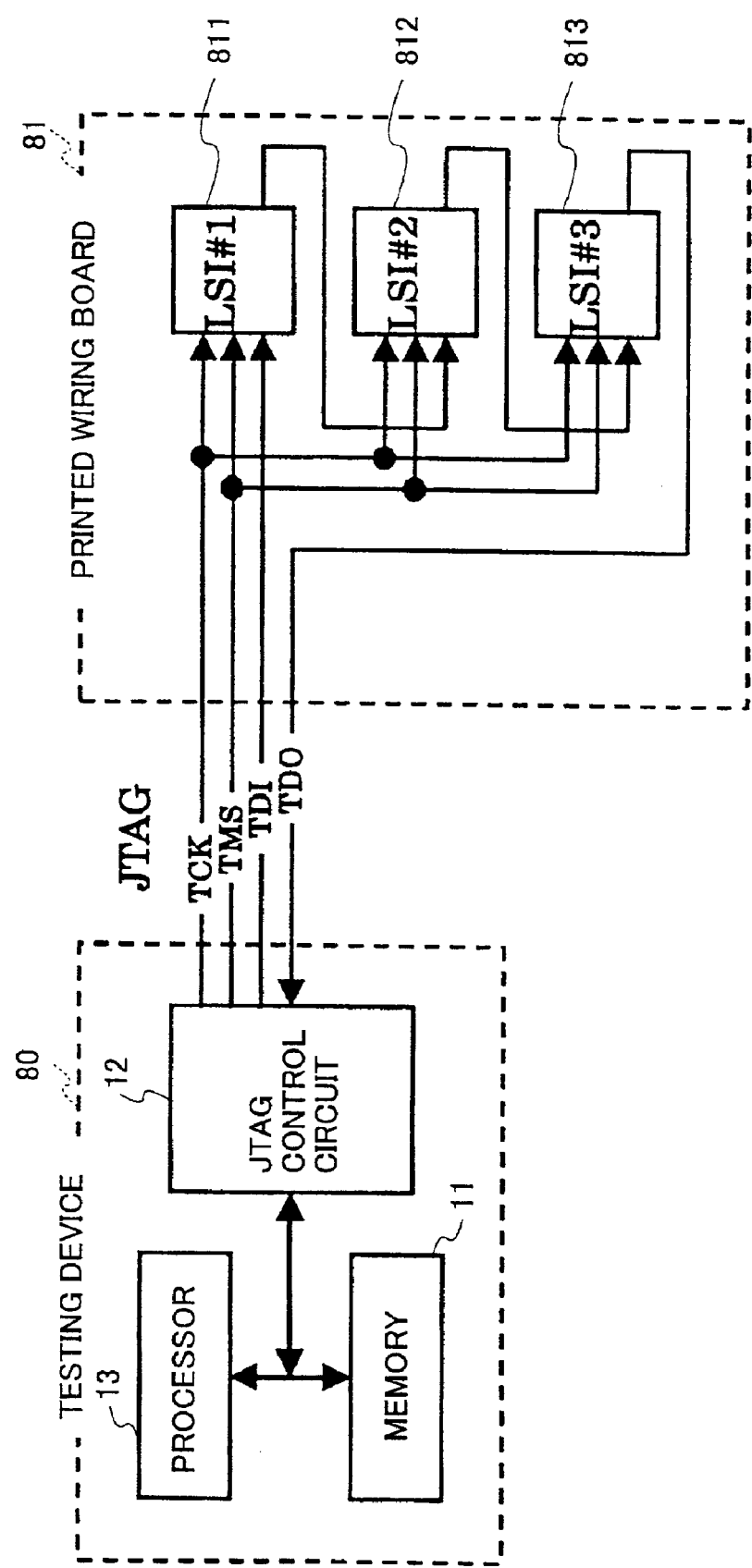
FIG. 37 is a block diagram of a testing device to which the present invention is applied.

Referring now to FIG. 37, a case where the present invention is applied to a printed wiring board testing device will be described. FIG. 37 is a block diagram of a printed wiring board testing device to which the present invention is applied. In FIG. 37, the same parts as in FIG. 3 are denoted by the same reference numerals, and explanation of those parts will be omitted.

As shown in FIG. 37, a printed wiring board testing device (or a testing device) 80 includes a memory 11, a JTAG control circuit 12, and a processor 13. A printed wiring board 81 to be tested or diagnosed includes LSI circuits (#1, #2, #3) 811 through 813 connected in such a manner as shown in FIG. 37.

In the printed wiring board 81 to be tested or diagnosed by the JTAG, devices such as LSI circuits 811 through 813 that are generally subjected to JTAG are connected to one another in line. The interface with the JTAG control circuit 12 is connected to those devices so as to conduct a test or a diagnosis.

In testing or diagnosing the printed wiring board 81, a value is set in each pin of the LSI circuits 811 through 813 (corresponding to the TAP 7 shown in FIG. 1) via the JTAG control circuit 12 so as to check whether the value is properly transferred. In this manner, the connections of patterns and solders can be checked. Although it is necessary to repeat the value setting and reading, the testing time and diagnosing time can be shortened with high-speed operations.

It should be noted that the present invention is not limited to the embodiments specifically disclosed above, but other variations and modifications may be made without departing from the scope of the present invention.

What is claimed is:

1. An access control device for conducting a test or diagnosis on an object to be tested or diagnosed by accessing a serial interface based on a command and data that specify a testing or diagnosing route, said device comprising:
   a memory;
   a control circuit configured to supply the command and data to the object, and to input data outputted from the object; and
   a processor, wherein the control circuit carries out a control to store the output data from the object in the memory as an output data string by executing an access sequence in accordance with a command string and an input data string developed in the memory, under control of the processor, and sets a state transition route for each objective state in advance so that the state transition route can be uniquely determined for an objective state specified by the command string.

2. The access control device as claimed in claim 1, wherein the serial interface is based on JTAG (IEEE standard 1149-1), and the command and data include JTAG control signals that include a TCK signal, a TMS signal, a TDI signal, and a TDO signal.

3. The access control device as claimed in claim 2, wherein the control circuit outputs a data string within the memory as the TDI signal during a shift operation, or otherwise returns data of the TDO signal as the TDI signal to the object.

4. The access control device as claimed in claim 2, wherein a command indicating an access sequence includes a command to automatically switch to an Exit-1 state after executing a shift operation a specified number of times.

5. The access control device as claimed in claim 4, wherein the command indicating the access sequence specifies the number of times an operation is repeated, so that a shift operation and an update operation can be performed a plurality of times in response to a single command.

6. The access control device as claimed in claim 2, wherein:
the object has an error detecting function provided in an instruction register and a data register, and
the processor has a status flag with respect to reading the instruction register in order to determine whether or not an instruction is executed correctly by reading the instruction register after execution of the instruction, so as to detect an error during execution of a long command sequence and to stop the command sequence when an error is detected.

7. The access control device as claimed in claim 2, wherein:
the object has a data register write flag and a data register read flag provided in an instruction register, and
the processor independently controls a write control operation and a read control operation with respect to the instruction register via the control circuit.

8. The access control device as claimed in claim 2, wherein:
the control circuit can be set by the JTAG control signals, and has a hierarchy select signal generating circuit configured to generate a hierarchy select signal for selecting an accessing object to be accessed within each hierarchical level, from a plurality of objects to be tested or diagnosed that are hierarchically arranged, so that the access control device has an apparent one-to-one relationship with each accessing object.

9. The access control device as claimed in claim 8, further comprising:
a hierarchy control device configured to select a plurality of accessing objects from upper to lower hierarchical levels of a hierarchical structure based on the hierarchy select signal, so as to supply data simultaneously to the plurality of accessing objects.

10. The access control device as claimed in claim 1, wherein:
the object is a printed wiring board, a device on the printed wiring board, a processing unit in a server system, or a device in the processing unit.

11. The access control device as claimed in claim 1, wherein the command includes an objective state and a shift count.

12. A method of testing a test object by accessing a serial interface based on a command and data that specify a testing route, said method comprising:
performing a control operation by executing an access sequence in accordance with a command string and an input data string developed within a memory of a testing device, and storing output data from the test object as an output data string in the memory; and
setting a state transition route for each objective state in advance, so that a transition route can be uniquely determined for an objective state specified by the command string.

13. The method as claimed in claim 12, wherein the serial interface is based on JTAG (IEEE standard 1149-1), and the command and data include JTAG control signals that include a TCK signal, a TMS signal, a TDI signal, and a TDO signal.

14. The method as claimed in claim 13, further comprising:
controlling, by a command, whether a data string stored in the memory is to be outputted as the TDI signal during a shift operation or data of the TDO signal is to be written as the output data string in the memory; and
returning the data of the TOO signal as the TDI signal to the test object when not outputting the input data string from the memory as the TDI signal.

15. The method as claimed in claim 13, wherein:
a command indicating an access sequence includes a command to automatically switch to an Exit-1 state after executing a shift operation a specified number of times.

16. The method as claimed in claim 15, wherein:
the command indicating the access sequence specifies the number of times an operation is repeated, so that a shift operation and an update operation can be performed a plurality of times in response to a single command.

17. The method as claimed in claim 13, wherein:
the test object has an error detecting function provided in an instruction register and a data register; and
a status flag with respect to reading the instruction register is provided in order to determine whether or not an instruction is executed correctly by reading the instruction register after execution of the instruction, so as to detect an error during execution of a long command sequence and to stop the command sequence when an error is detected.

18. The method as claimed in claim 13, wherein the test object has a data register write flag and a data register read flag provided in an instruction register, and further comprising:
independently controlling a write control operation and a read control operation with respect to the instruction register.

19. The method as claimed in claim 13, further comprising:
setting the JTAG control signals; and
generating a hierarchy select signal for selecting an accessing object to be accessed within each hierarchical level, from a plurality of test objects that are hierarchically arranged, so that an access control device used to conduct the testing of the test object has an apparent one-to-one relationship with each accessing object.

20. The method as claimed in claim 19, further comprising:
selecting a plurality of accessing objects from upper to lower hierarchical levels of a hierarchical structure based on the hierarchy select signal, so as to supply data simultaneously to the plurality of accessing objects.

21. The method as claimed in claim 12, wherein the test object is a printed wiring board, a device on the printed wiring board, a processing unit in a server system, or a device in the processing unit.

22. The method as claimed in claim 12, wherein the command includes an objective state and a shift count.

* * * * *

UNITED STATES PATENT AND TRADEMARK OFFICE
CERTIFICATE OF CORRECTION

PATENT NO. : 6,938,191 B2  
APPLICATION NO. : 10/103787  
DATED : August 30, 2005  
INVENTOR(S) : Keiji SATO et al.

Page 1 of 1

It is certified that error appears in the above-identified patent and that said Letters Patent is hereby corrected as shown below:

Column 14, Line 11, delete "TOO" and insert --TDO-- therefor.

Signed and Sealed this

Eighth Day of August, 2006

JON W. DUDAS  
*Director of the United States Patent and Trademark Office*